United States Patent
Hisada et al.

(10) Patent No.: US 10,991,685 B2
(45) Date of Patent: Apr. 27, 2021

(54) ASSEMBLING OF CHIPS BY STACKING WITH ROTATION

(71) Applicant: International Business Machines Corporation, Armonk, NY (US)

(72) Inventors: Takashi Hisada, Hachiouji (JP); Toyohiro Aoki, Yokohama (JP); Eiji Nakamura, Kawasaki (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 108 days.

(21) Appl. No.: 16/249,639

(22) Filed: Jan. 16, 2019

(65) Prior Publication Data

US 2020/0227400 A1 Jul. 16, 2020

(51) Int. Cl.
*H01L 25/00* (2006.01)
*H01L 21/768* (2006.01)
*H01L 23/48* (2006.01)
*H01L 25/065* (2006.01)
(Continued)

(52) U.S. Cl.
CPC ........ *H01L 25/50* (2013.01); *H01L 21/76898* (2013.01); *H01L 23/481* (2013.01); *H01L 24/33* (2013.01); *H01L 24/83* (2013.01); *H01L 24/94* (2013.01); *H01L 25/0657* (2013.01);
(Continued)

(58) Field of Classification Search
CPC ............ H01L 25/0657; H01L 25/0652; H01L 25/06541; H01L 24/33; H01L 21/768; H01L 21/05; H01L 23/481; H01L 24/94; H01L 25/50; H01L 23/5384; H01L 21/76898; H01L 2225/06562; H01L 27/0207; H01L 2225/06541
See application file for complete search history.

(56) References Cited

U.S. PATENT DOCUMENTS

| | | | |
|---|---|---|---|
| 2007/0096263 A1 | 5/2007 | Furukawa et al. | |
| 2010/0142115 A1 | 6/2010 | Bae et al. | |
| 2011/0065214 A1 | 3/2011 | Farooq et al. | |
| | (Continued) | | |

FOREIGN PATENT DOCUMENTS

CN 101202149 A 6/2008

OTHER PUBLICATIONS

Horibe et al., "Through Silicon Via Process for Effective Multi-Wafer Integration," 2015, IEEE 65th Electronic Components and Technology Conference (ECTC), pp. 1808-1812, IEEE, 5 pages.
(Continued)

*Primary Examiner* — Jasmine J Clark
(74) *Attorney, Agent, or Firm* — Amin, Turocy & Watson, LLP

(57) ABSTRACT

A technique of assembling a plurality of chips is disclosed. A plurality of chip layers, each of which includes at least one chip block, is prepared. Each chip block includes a plurality of electrodes assigned the same function. The plurality of the chip layers is sequentially stacked with rotation so as to configure at least one stack of overlapping chip blocks. Each stack holds a plurality of groups of vertically arranged electrodes with shifts in horizontal plane. A through hole is formed, for at least one of the groups, into the plurality of the chip layers at least in part so as to expose electrode surfaces of vertically arranged electrodes in the group. The through hole is filled with conductive material.

25 Claims, 20 Drawing Sheets

(51) Int. Cl.
 *H01L 23/00* (2006.01)
 *H01L 27/02* (2006.01)
(52) U.S. Cl.
 CPC ............... *H01L 27/0207* (2013.01); *H01L 2225/06541* (2013.01); *H01L 2225/06562* (2013.01)

(56) References Cited

U.S. PATENT DOCUMENTS

| | | |
|---|---|---|
| 2013/0307159 A1 | 11/2013 | Safran et al. |
| 2014/0361426 A1 | 12/2014 | Moon et al. |
| 2015/0123284 A1* | 5/2015 | Jo ................... H01L 25/0657 257/774 |
| 2017/0179096 A1 | 6/2017 | Dang et al. |

OTHER PUBLICATIONS

"Euclidean tilings by convex regular polygons," Wikipedia, 36 pages. Retrieved on Jun. 8, 2018. https://en.wikipedia.org/wiki/Euclidean_tilings_by_convex_regular_polygons.
International Search Report and Written Opinion received for PCT Application Serial No. PCT/IB2020/050229 dated May 9, 2020, 9 pages.

\* cited by examiner

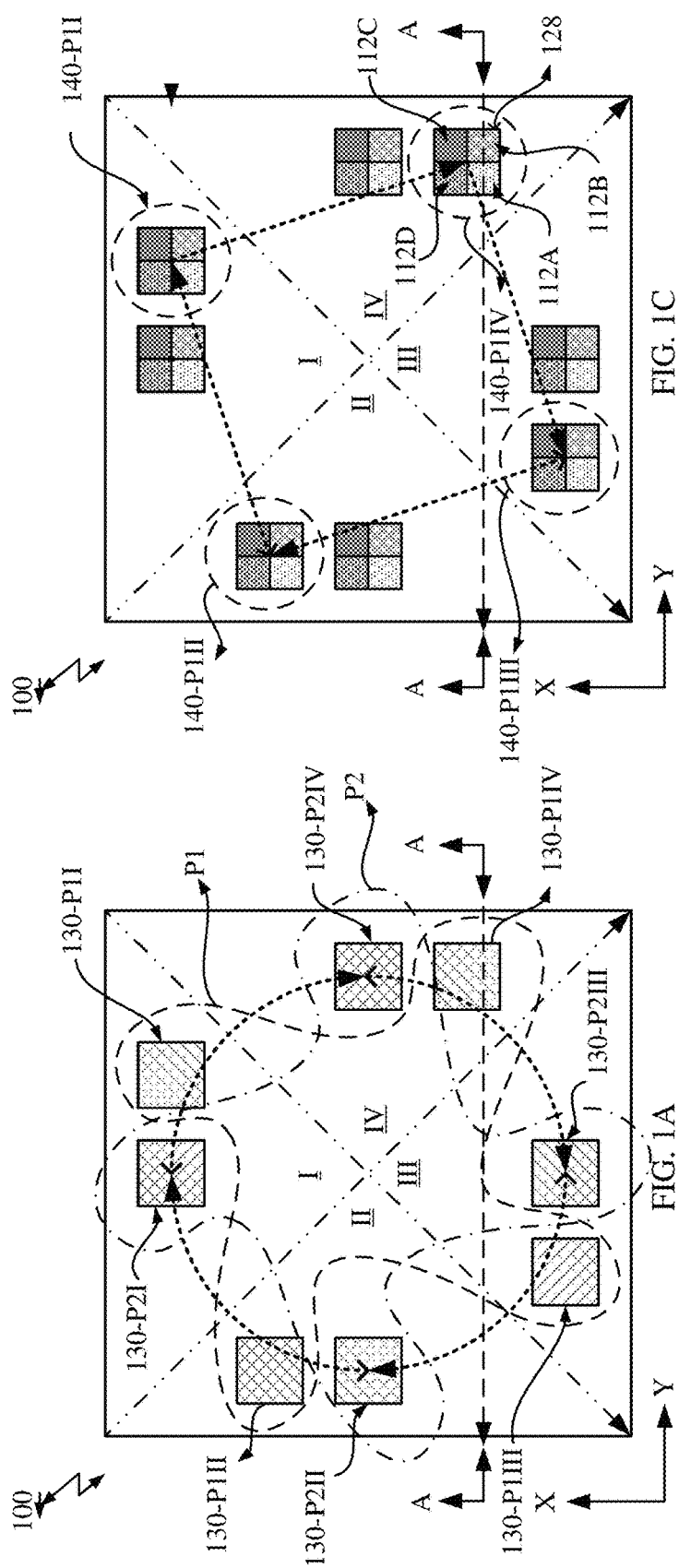
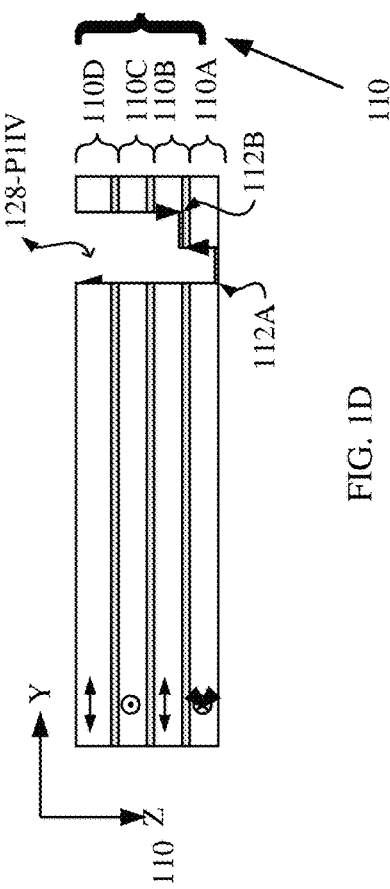
FIG. 1A
FIG. 1B
FIG. 1C
FIG. 1D

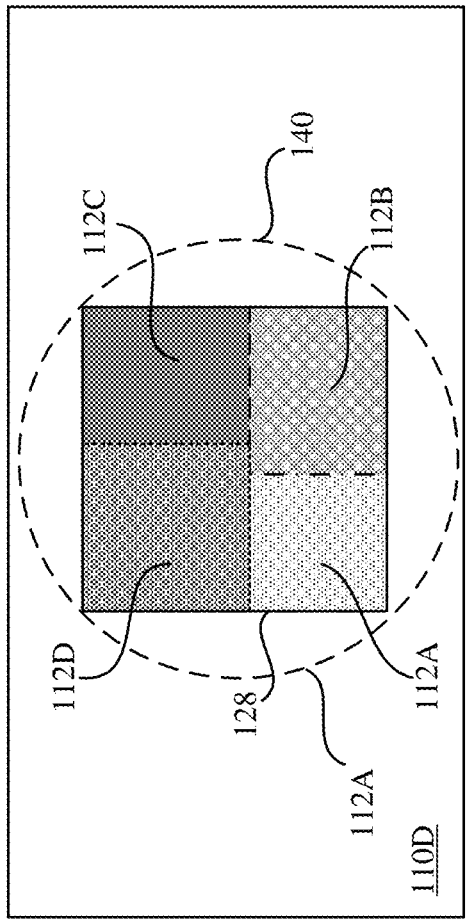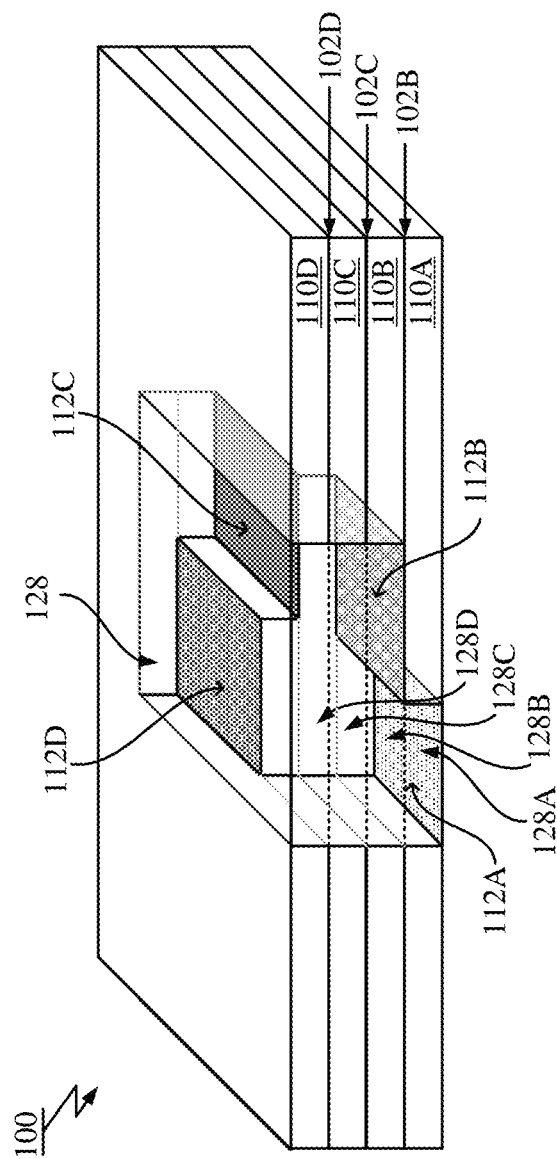
FIG. 3A
FIG. 3B

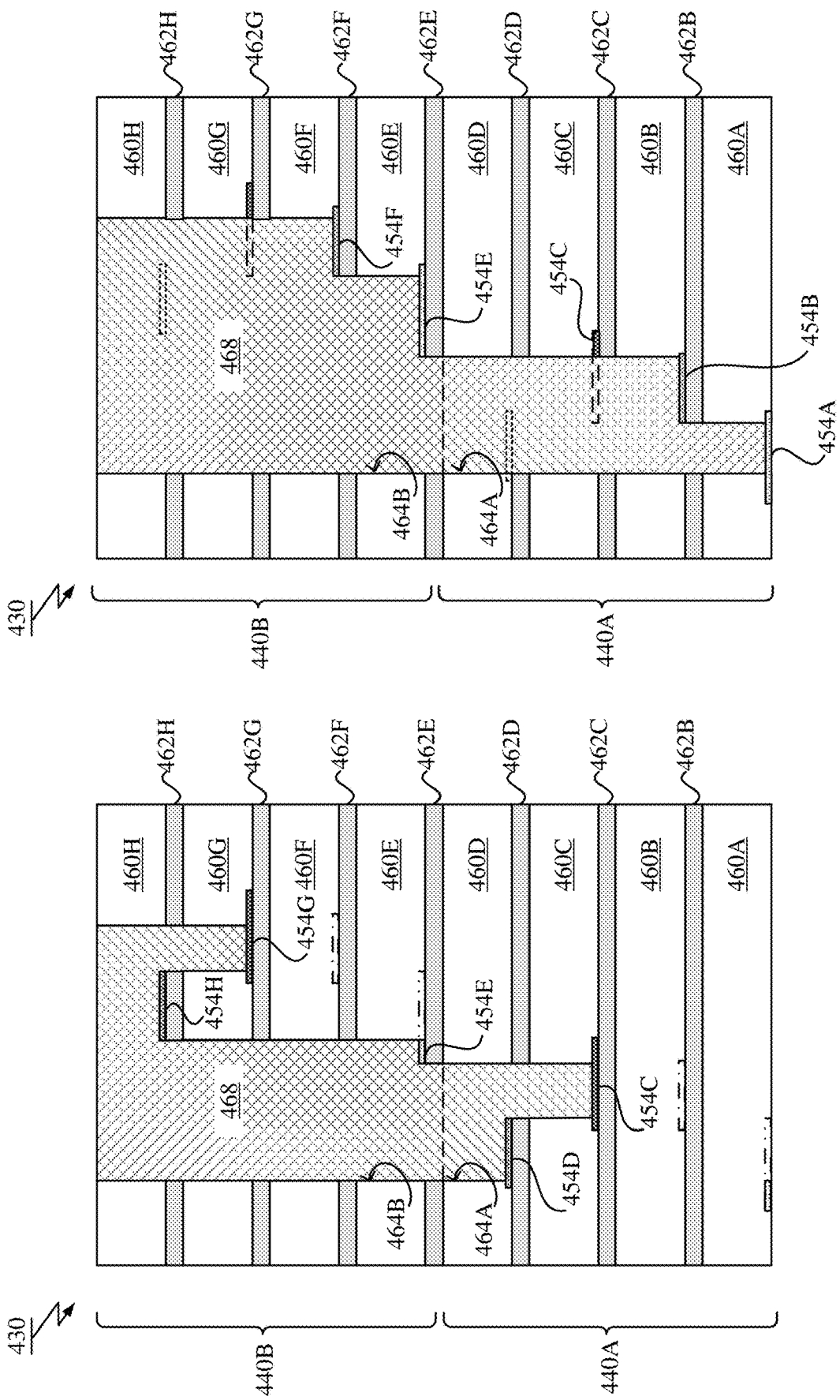

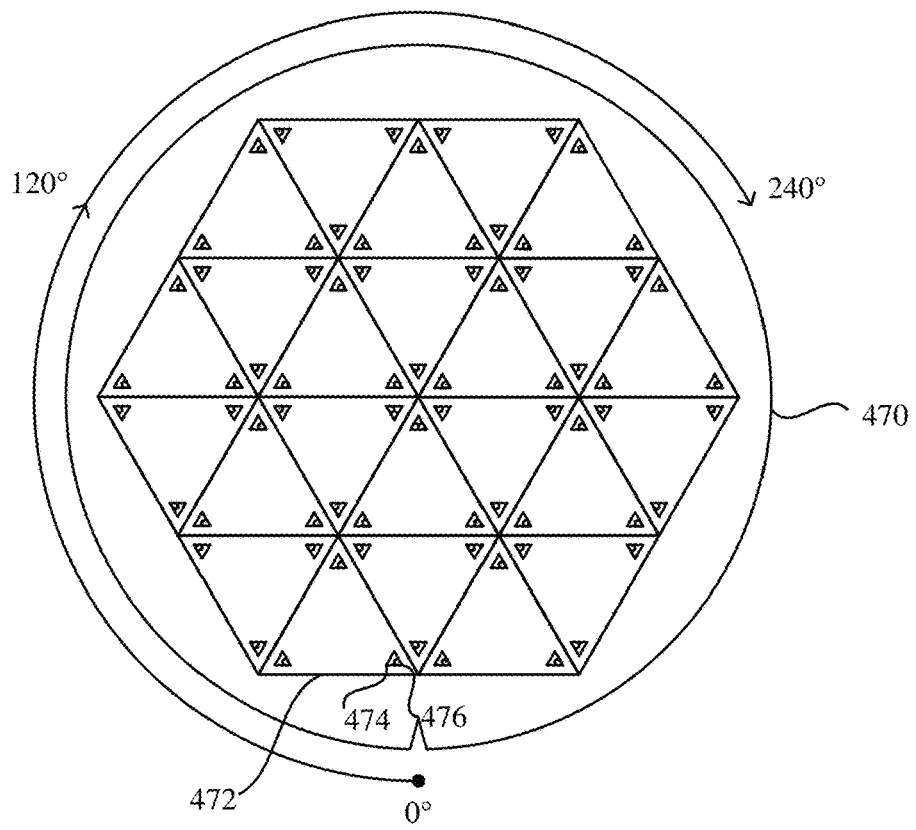
FIG. 15A
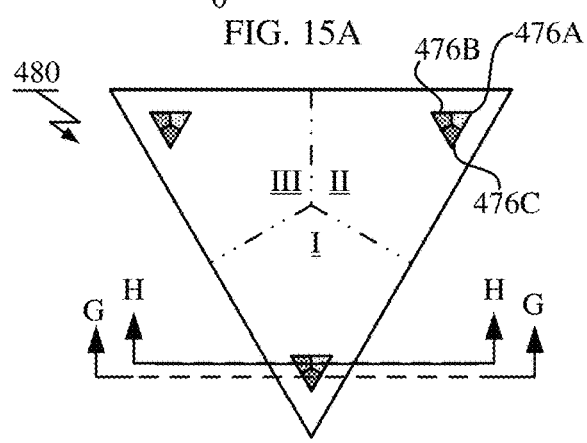
FIG. 15B
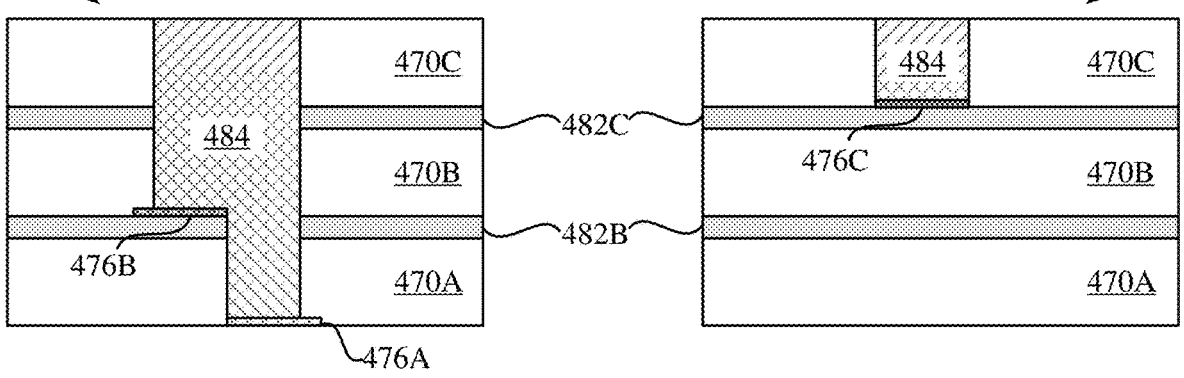
FIG. 15C
FIG. 15D

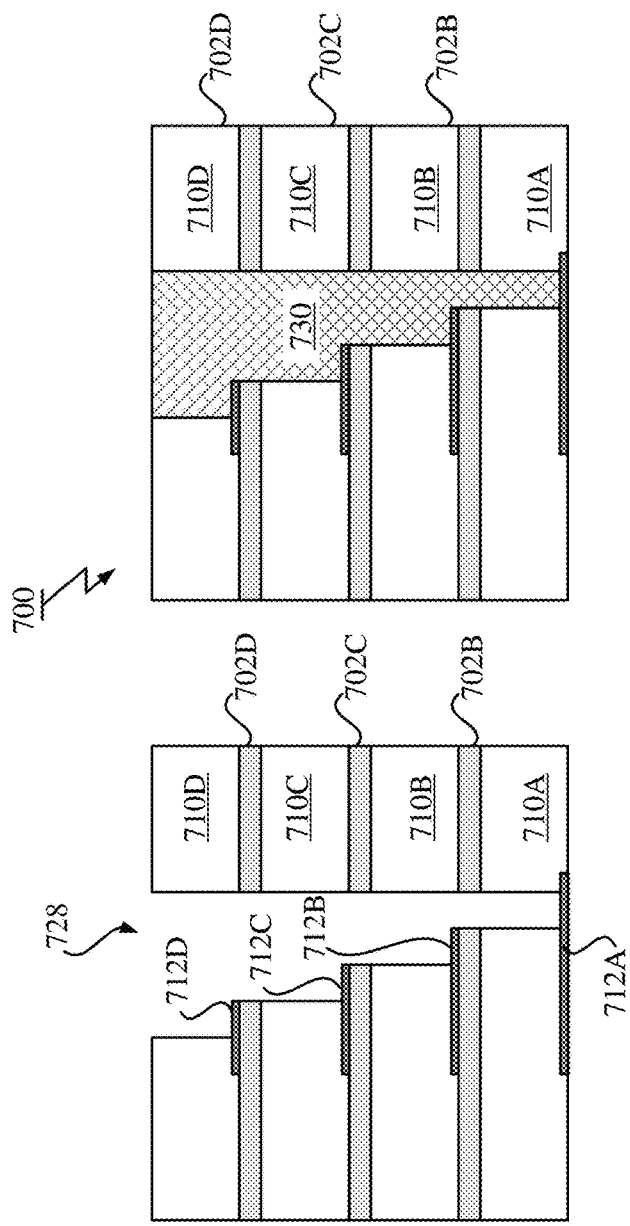
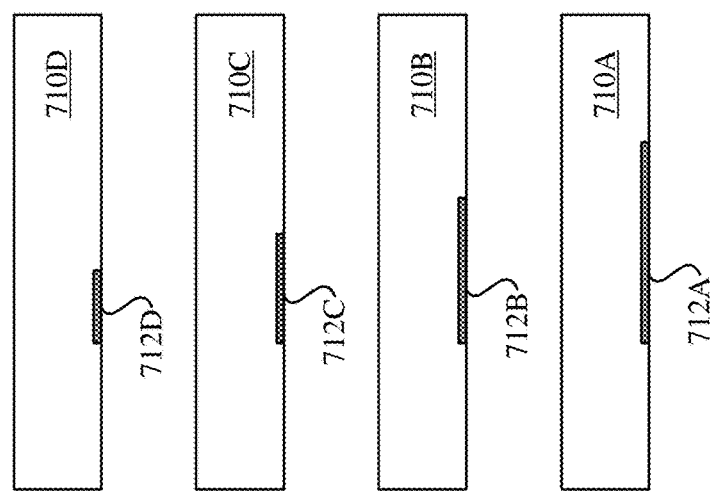
FIG. 20A  FIG. 20B  FIG. 20C

ASSEMBLING OF CHIPS BY STACKING WITH ROTATION

BACKGROUND

One or more embodiments generally relates to assembling of chips, and more particularly, to a method of assembling a plurality of chips, a chip structure for using in the method and a stacked chip structure including a plurality of chips.

SUMMARY

In response to growing demand for higher performance and higher density integration of semiconductor devices, 3D integration technology that enables wide band signal transmission and short wiring length has been attracted attention for improving the performance of the computer systems in the future.

Three-dimensional (3D) integrations with Through Silicon Vias (TSVs) has been widely studied and developed. In conventional techniques of the 3D packaging with the TSV, the TSV formed through the silicon wafer is filled by Copper (Cu) plating, then the silicon wafer with the TSV is subjected to dicing to obtain a plurality of singulated semiconductor chips and finally the singulated chips are stacked and bonded with the TSVs. Interconnections between the stacked chips are generally achieved by solder bump joining.

In the production process of 3D chip assemblies, designs of through holes are sometimes required to be different for each stacking level even though the chips have same functionality (i.e., homogeneous integration). Thus, designs and mask patterns of the pads are unique for each stacking level, resulting in variation of the pad designs and the mask patterns. Thus, it is required that unique part number (P/N) is assigned to each stacking level, which complicates production control. Also, when yield for each stacking level is significantly different, many surplus parts would be produced, thereby degrading efficiency of the production process.

Therefore, there is a need for a novel chip assembling technology capable of reducing a complexity of production control and improving efficiency of production of chip assembly.

According to an embodiment of the present invention, a method of assembling a plurality of chips is provided. The method includes preparing a plurality of chip layers, each of which includes at least one chip block. Each chip block including a plurality of electrodes assigned the same function. The method also includes sequentially stacking the plurality of the chip layers with rotation so as to configure at least one stack of overlapping chip blocks, in which each stack holds a plurality of groups of vertically arranged electrodes with shifts in horizontal plane. The method further includes forming, for at least one of the groups, a through hole into the plurality of the chip layers at least in part so as to expose electrode surfaces of vertically arranged electrodes in the group. The method includes further filling the through hole with conductive material.

By using the method according to the embodiment of the present invention, production control of chip assembly can be simplified and efficiency of production of the chip assembly can be improved. Since a variety of chip designs, mask designs and the number of parts numbers can be reduced regardless of stacking level, design work load, non-recurring engineering cost, complexity of production control and waste of production can be reduced.

In an embodiment, the at least one chip block includes an array of chip blocks arranged in a manner of rotational symmetry, the stacking of the plurality of the chip layers is performed such that each chip block in the array of one of the chip layers overlaps with a symmetrically located chip block in the array of other of the chip layers, and the at least one stack of the overlapping chip blocks includes an array of stacks of overlapping chip blocks. Thereby, a plurality of chip assemblies can be fabricated at once with a lower complexity of production control and higher efficiency of production.

In a particular embodiment, the stacking of the plurality of the chip layers includes bonding the plurality of the chip layers with one or more insulating adhesive layers, in which each stack of the overlapping chip blocks holds a corresponding portion of each of the one or more insulating adhesive layers.

In other particular embodiment, each corresponding portion of at least two of the one or more insulating adhesive layers have an opening as a part of the through hole to be formed.

In another embodiment, each electrode surface is configured to work as a stopper against hole formation and has a shape enabling formation of a center portion of the through hole penetrating through the plurality of the chip layers, in which the center portion of the through hole is a portion not covered by any of the electrode surfaces. Thereby, generation of residual voids in the through hole at the space removed from the insulating adhesive layer can be minimized even though the openings is formed into the insulating adhesive layer with a single mask design prior to stacking.

In a particular embodiment, the rotational symmetry of arrangement of the array is n-fold rotational symmetry and each rotation performed in stacking one of the chip layers onto other of the chip layers is a rotation with $360/n*i$ ($i= 1, \ldots, n-1$) degrees around the center of the arrays with respect to a base position of stacking, and the number of the chip layers is n, each chip block has a unit shape of tessellation and the through hole is formed through n or n−1 chip layers.

In another embodiment, n is 4 and each chip block has a square shape. Thereby, it is not required that design tool, lithography tool and dicing tool are adapted for special shape other than rectangular. Standard design tool, lithography tool and dicing tool can be used without any adaptation.

In another embodiment, the preparing of the plurality of the chip layers, the stacking of the plurality of the chip layers and the forming of the through hole are performed repeatedly to obtain a plurality of stacked layer assemblies. The forming of the through hole is performed such that the through hole penetrates each stacked layer assembly in part. The method further includes stacking the plurality of the stacked layer assemblies such that the through holes of the stacked layer assemblies communicate with each other. The filling of the through hole is performed at once for the plurality of the stacked layer assemblies stacked. Alternatively, the preparing of the plurality of the chip layers and the stacking of the plurality of the chip layers are performed repeatedly to obtain a plurality of stacked layer assemblies. The method further includes stacking the plurality of the stacked layer assemblies with a translational shift. The forming of the through hole and the filling of the through hole are performed at once for the plurality of the stacked layer assemblies, respectively. Thereby, the number of the stacking level can be double, triple, and so on.

In another embodiment, each chip layer prepared has a form of a wafer or panel, and the method further includes dicing the plurality of the chip layers into a plurality of chip assemblies, in which each chip assembly corresponds to each stack of the overlapping chip blocks. Interconnections can be established at the wafer or panel level instead of chip level.

In a further embodiment, the forming of the through hole is performed by etching and/or laser processing and the filling of the through hole is performed by IMS (Injection Molded Soldering) technology. Thereby, production cost can be further reduced. Flexibility of alloy composition of conductive material and fine pith capability can be obtained. It is applicable even if the number of the layers increases and accordingly the aspect ratio of through hole becomes high.

In a particular embodiment, each chip block has a semiconductor device or a thin film battery.

According to other embodiment of the present invention, a chip structure is provided. The chip structure includes a chip layer that includes at least one chip block, each of which has a plurality of regions where formation of a via hole through the chip layer is allowed. The chip structure also includes a plurality of electrodes located at respective positions of the regions for each chip block. The plurality of the electrodes is assigned the same function and has respective electrode surfaces arranged such that each electrode surface is configured to be adjacent to other one of the electrode surfaces with shift in horizontal plane when a rotation operation around the center of the chip block is applied to the other one of the electrode surfaces.

The chip structure according to the other embodiment of the present invention can be used as a piece of any stacking level for assembling a plurality of chips. By using the chip structure, production control of chip assembly can be simplified and efficiency of production of chip assembly can be improved. Since variety of chip designs, mask designs and the number of parts numbers can be reduced regardless of stacking level, design work load, non-recurring engineering cost, complexity of production control and waste of production can be reduced.

According to further other embodiment of the present invention, a stacked chip structure is provided. The stacked chip structure includes a plurality of chip layers stacked with rotations so as to form a stack of overlapping chip blocks. At least two of the overlapping chip blocks in each stack have respective via holes communicating with each other to form a through hole. The stacked chip structure also includes a plurality of groups of vertically arranged electrodes assigned the same function, for each stack of the overlapping chip blocks. The vertically arranged electrodes in each group are arranged to have shifts in horizontal plane. The stacked chip structure further includes a conductive material filled in the through hole for each stack of the overlapping chip blocks. The conductive material filled in the through hole is in contact with electrode surfaces of vertically arranged electrodes of one of the groups.

The stacked chip structure according to the further other embodiment of the present invention is low cost and easy to fabricate with reliable connectivity.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter, which is regarded as the invention, is particularly pointed out and distinctly claimed in the claims at the conclusion of the specification. The foregoing and other features and advantages of the invention are apparent from the following detailed description taken in conjunction with the accompanying drawings. Note that the sizes and relative positions of elements and layers in the drawings are not necessarily drawn to scale. Some of these elements or layers are arbitrarily enlarged and positioned for improving legibility of drawing.

FIGS. 1A, 1B, 1C and 1D illustrate top views and cross-sectional views of a stacked semiconductor chip assembly with and without vertical conductors according to an embodiment of the present invention.

FIGS. 3A and 3B illustrate an enlarged top view and a perspective view of the stacked semiconductor chip assembly without vertical conductors around one vertical conductor according to the embodiment of the present invention.

FIGS. 14A and 14B illustrate cross-sectional views of a structure obtained at each step of the alternative assembling process according to the particular embodiment of the present invention.

FIGS. 15A, 15B, 15C and 15D illustrates a way of fabricating a stacked semiconductor chip assembly with regular triangle shape according to a particular embodiment of the present invention.

FIGS. 20A-20C illustrate cross-sectional views of a structure obtained at each step of related assembling process with a plurality of electrode layouts dedicatedly designed for each stacking level.

DETAILED DESCRIPTION

Figure 2A:
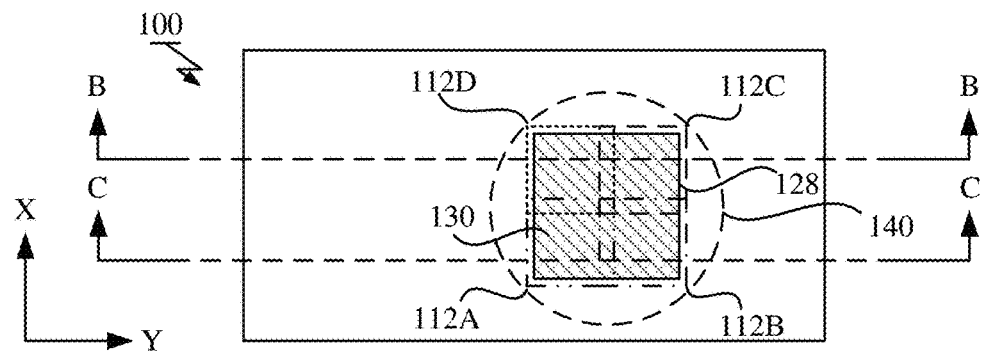
FIGS. 2A, 2B and 2C illustrate an enlarged top view and enlarged cross-sectional views of the stacked semiconductor chip assembly around one vertical conductor according to the embodiment of the present invention.

Hereinafter, one or more embodiments of the present invention will be described, but it will be understood by those skilled in the art that the embodiments described below are mentioned only by way of examples and are not intended to limit the scope of the present invention.

One or more embodiments according to the present invention are directed to methods of assembling a plurality of chips, chip structures for using in the methods and stacked chip structures fabricated by the methods, in which a plurality of chips are stacked in a novel manner.

Hereinafter, with reference to a series of FIGS. 1A, 1B, 1C and 1D, FIGS. 2A, 2B and 2C, and FIGS. 3A and 3B, a stacked chip structure according to an embodiment of the present invention will be described. The stacked chip structure according to the embodiment is a stacked semiconductor chip assembly 100 including a plurality of semiconductor chips.

FIGS. 1A and 1B illustrate a cross-sectional view and a top view of a stacked semiconductor chip assembly 100, respectively. Note that the cross-sectional view shown in FIG. 1B corresponds to a cross-section indicated by "A" in the top view of FIG. 1A.

As shown in FIGS. 1A and 1B, the stacked semiconductor chip assembly 100 includes a plurality of semiconductor chip layers (shown as 110 in FIG. 1B) stacked in sequence; and a plurality of vertical conductors 130 formed into the plurality of the semiconductor chip layers 110. The plurality of the semiconductor chip layers 110 may be bonded by interlayer insulating adhesives, each of which is interposed between upper and lower semiconductor chip layers 110. The interlayer insulating adhesives will be described later in more detail.

Each semiconductor chip layer 110 corresponds to one semiconductor chip (also referred to as "die"). Each semiconductor chip layer 110 is made of semiconductor material such as a silicon, silicon carbide, sapphire, and compound semiconductors (e.g., Gallium Phosphide (GaP), Gallium Arsenide (GaAs), Indium Phosphide (InP), Gallium Nitride (GaN)), etc.

The plurality of the semiconductor chip layers 110 may have an identical shape having rotational symmetry. The shape of each semiconductor chip layer 110 is identical to a unit shape of tessellation, more specifically, regular tessellation. In one or more particular embodiments, the shape of the semiconductor chip layers 110 may be square, regular triangle or regular hexagon. In an embodiment, each semiconductor chip layer 110 has an approximately square shape having 4-fold rotational symmetry, as shown in FIG. 1A.

In the described embodiment shown in FIGS. 1A and 1B, there are four semiconductor chip layers 110A-110D in the stacked semiconductor chip assembly 100. The number of chip layers in the stacked semiconductor chip assembly 100 corresponds to the order of the rotational symmetry of the shape of the semiconductor chip layers 110.

The semiconductor chip layers 110 are stacked with rotations, as indicated by the notation of the arrows depicted in FIG. 1B. The direction of the arrow represents the reference orientation of the semiconductor chip layer 110 to which the arrow is labelled. The rotation applied to each semiconductor chip layer 110 with respect to a base position (e.g. the bottom layer 110A) is a rotation with 360/n*i (i= 1, . . . , n−1) degrees around the center of the stacked semiconductor chip assembly 100 (and also semiconductor chip layers 110), where n denotes the order of the rotational symmetry of the shape of the semiconductor chip layers 110. Note that the center of the assembly 100 is indicated by two diagonal two-dot chain lines. In the described embodiment shown in FIGS. 1A-1B, n is four and the angle of the rotations are 90, 180 and 270 degrees with respect to the base position (i.e., 0 degree), respectively.

The vertical conductor 130 interconnects the plurality of the semiconductor chip layers 110. Each vertical conductor 130 is made of conductive material, which may include a metal, metal alloy and/or other conductive material. In an embodiment, conductive material is a solder, which can be easily fabricated by the IMS (Injection Molded Soldering) Technology with solder alloy composition being adjust flexibly. Each vertical conductor 130 has a step-structure as depicted in FIG. 1B.

The plurality of the vertical conductors 130 is divided into a plurality of groups. Different functions (denoted by an identifier "Px", where x denotes an index of functions) may be assigned to each of the plurality of the groups of the vertical conductors 130. The plural vertical conductors 130 in the same group are assigned as the same function. Note that a function assigned to a certain vertical conductor means a role of interconnection provided by the certain vertical conductor 130. For example, ground (GND), power supply (VCC), and a specific input/output signal are kinds of the functions.

In the described embodiment shown in FIGS. 1A and 1B, the number of the groups of the plural vertical conductors 130 is two, which corresponds to the number of the functions to be interconnected for each semiconductor chip layer 110. The number of the vertical conductors 130 in each group (i.e., each function) is four, which may correspond to the order of the rotational symmetry. Hence, there are two groups of vertical conductor, including a first group of four vertical conductors 130-P1I, 130-P1II, 130-P1III, 130P1IV (encompassed by a dashed loop line in FIG. 1A) assigned the function "P1" and a second group of four vertical conductors 130-P2I, 130-P2II, 130-P2III, 130-P2IV (encompassed by a chain loop line in FIG. 1B) assigned the function "P2", in the described embodiment shown in FIGS. 1A-1B.

The top surface of the stacked semiconductor chip assembly 100 can be divided into a plurality of regions where one set of vertical conductors 130 having different functions are fabricated, respectively. The number of the regions corresponds to the order of the rotational symmetry. In the described embodiment shown in FIGS. 1A and 1B, there are four regions (I, II, III, IV) delimited by the two two-dot chain diagonal lines, each of which has one set of vertical conductors 130 having different functions (P1, P2). Note that the way of delimiting the surface of the stacked semiconductor chip assembly 100 is not limited, as long as the regions delimited having the same rotational symmetry as the shape of the semiconductor chip layers 110.

The layout of the vertical conductors 130 have also the same rotational symmetry as the shape of the semiconductor chip layer 110. More specifically, the positions of the vertical conductors in each group or function (e.g., 130-P1I, 130-P1II, 130-P1III, 130-P1IV) and relative positional relationships among the vertical conductors 130 having different functions (e.g., geometries of 130-P1y and 130-P2y; y=I, II, III, IV) have the same rotational symmetry, as indicated by the dot curved arrows in FIG. 1A.

Note that the number of the groups and the number of the functions are examples shown in FIGS. 1A-1B, and are not limited to the specific value (i.e., two). The number of the groups and the number of the functions may depend on a specification of the semiconductor chips 110. There may be more than two groups and functions in other particular embodiments.

FIGS. 1C and 1D illustrates a top view and a cross sectional view of the stacked semiconductor chip assembly 100, respectively, when the vertical conductors 130 are transparently shown. Note that the cross-sectional view shown in FIG. 1D corresponds to a cross-section indicated by "A" in the top view shown in FIG. 1C.

As shown in FIGS. 1C and 1D, the stacked semiconductor chip assembly 100 further includes, for each vertical conductor 130, a plurality of electrodes (also referred to as pads) 112 formed on the surface of the semiconductor chip layer (shown as 110 in FIG. 1D); and a through hole 128 through which the surfaces of these electrodes 112 can be seen in the top view of FIG. 1C. The "through" hole 128 is a hole penetrating through at least one chip layer 110. The through hole 128 does not have to penetrate through the entire of the stacked chip layers 110. Note that the electrode surfaces of the different levels are indicated by different hatching. Each electrode 112 may be made of any one of metal materials (e.g., Cu, Al, etc.) and other conductive materials.

In the described embodiment shown in FIGS. 1C and 1D, the number of the electrodes 112 for each vertical conductor 130 is four, which corresponds to the order of the rotational symmetry of the shape of the semiconductor chip layers 110. Thus, electrode surfaces of four electrodes 112A~112D can be seen at each location of the vertical conductors 130 in the top view of FIG. 1C. Note that numerals are labelled to merely one representative group of electrodes for a particular vertical conductor 130-P1IV.

As shown in FIG. 1C, these four electrodes 112A~112D constitutes one group of vertically arranged electrodes 140 (more specifically the group 140-P1IV since it corresponds to the vertical conductor 130-P1IV). As shown in FIG. 1C, the vertically arranged electrodes 112A~112D are shifted each other in the horizontal plane such that the electrode surfaces of every vertically arranged electrode 112A~112D can be seen at least partially from the top when assuming that there is no conductive material of the vertical conductor 130. Each electrode surface of the vertically arranged electrodes 112A~112D provides a bottom or a step, as shown in FIG. 1D, resulting in a staircase-like structure.

Note that the term "vertical" is defined as a direction perpendicular to the main surface (a top or back surface) of the stacked semiconductor chip assembly 100 (and also the chip layers 110), which matches the stacking direction. The vertical direction is denoted by an arrow labelled "Z" in FIGS. 1B and 1D. The term "horizontal" is defined as a direction within a plane perpendicular to the vertical direction, which matches a plane of the main surface of the stacked semiconductor chip assembly 100 (and also the chip layers 110). The horizontal plane is represented by the arrows labeled "X" and "Y" in FIGS. 1A and 1C.

Furthermore, the electrode surfaces of the vertically arranged electrodes 112A~112D in the group 140 are arranged so as to make one round in the horizontal plane. In contrast to the vertical conductors 130, the geometries of the vertically arranged electrodes for each function (e.g., groups 140-P1I, 140-P1II, 140-P1III, 140-P1IV) do not have the same rotational symmetry as the shape of the semiconductor chip layer 110 but have translational symmetry in the horizontal plane as indicated by dashed arrows in FIG. 1C.

Note that in the described embodiment, there are four vertical conductors 130-PxI~130-PxI~IV for each function (e.g., x=1, 2), in which the vertical conductors 130 are located at respective positions of every group of the vertically arranged electrodes 140-Pxy (x=1, 2; y=I, II, III, IV). However, in other embodiment, for each function (e.g., Px; x=1,2), there is at least one vertical conductor 130-Pxy (e.g., y=at least one of I, II, III and IV).

FIG. 2A illustrates an enlarged top view of the stacked semiconductor chip assembly 100 around one vertical conductor 130. The outlines of the electrode surfaces of the four vertically arranged electrodes 112A~112D are represented by a two-dot chain line (112A), a chain line (112B), dashed line (112C) and a dot line (112D), respectively.

Each electrode 112 has a size slightly larger than 1/n of the size of the through hole 128 (and also the vertical conductor 130), in consideration of placement accuracy of stacking. As shown in FIG. 2A, the vertically arranged electrodes 112A~112D are arranged such that each electrode surface is adjacent to, shifted, at least in part, from and overlapped with other one of the vertically arranged electrodes 112A~112D in the horizontal plane. For example, the electrode 112A is adjacent to the electrodes 112B, 112D, overlapped partially with the electrodes 112B, 112D and slightly shifted from both of the electrodes 112B, 112D along with respective directions in the horizontal plane. The same may hold for other electrodes 112B~112D.

Figure 2B:
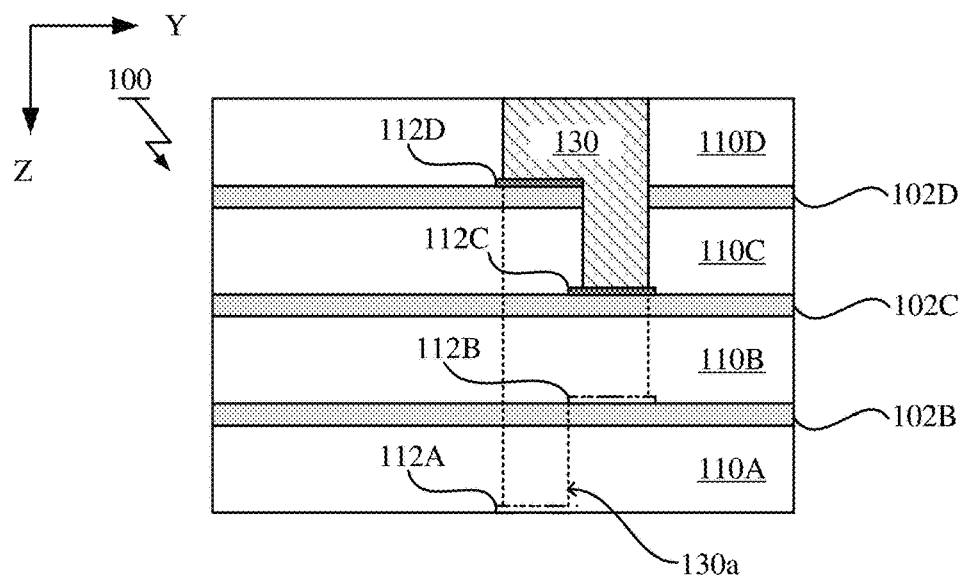
Figure 2C:
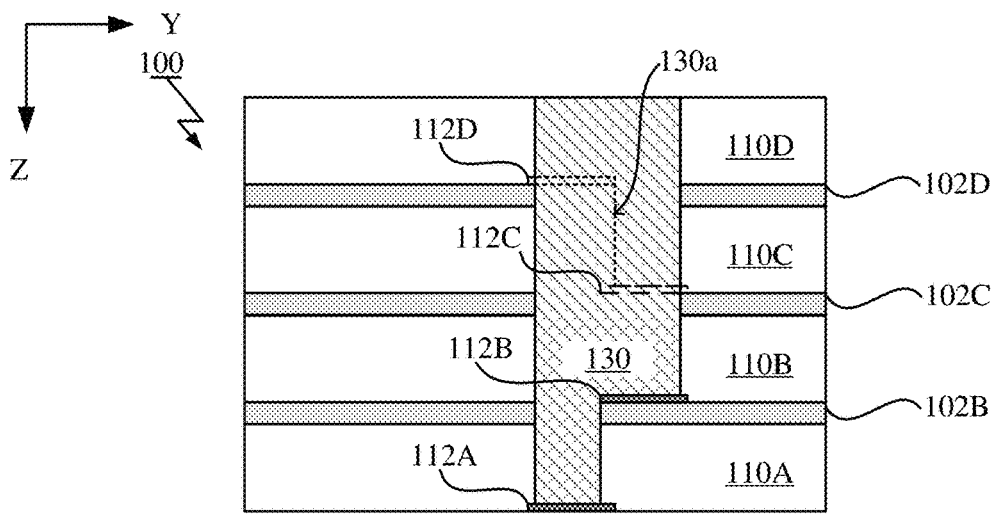

FIGS. 2B and 2C illustrate enlarged cross-sectional views of the stacked semiconductor chip assembly 100 around one vertical conductor 130. Note that the cross-sectional views shown in FIGS. 2B and 2C correspond to cross-sections indicated by "B" and "C" in the top view shown in FIG. 2A, respectively. Also note that even for elements that do not intersect the corresponding cross-section, the outlines of such elements are indicated by lines other than the solid line, such as dot lines, dash lines, and the like.

More specifically, the outlines of the vertical conductor 130 intersecting at the cross-sections indicated by "C" and "B" are depicted by the dot line 130a in the cross sectional views of FIGS. 2B and 2C, respectively. The outlines of the electrodes 112 A, 112B intersecting at the cross-section indicated by "C" are depicted by the chain line and the two-dot chain line in the cross sectional view of FIG. 2B. The outlines of the electrodes 112C, 112D intersecting at the cross-section indicated by "B" are depicted by the dash line and dot line in the cross sectional view of FIG. 2C.

As shown in FIGS. 2B and 2C, the stacked semiconductor chip assembly 100 may further include one or more interlayer insulating adhesives 102B~102D, each of which is interposed between upper and lower chip layers (110A-110B, 110B-110C, 110C-110D). Each interlayer insulating adhesive 102 may be made of any one of insulating resins such as PI (polyimide), BCB (benzocyclobutene), polybenzoxazole (PBO), or other polymers.

The vertically arranged electrodes 112A~112D are located at respective levels of the surfaces of the semiconductor chip layers 110. The vertically arranged electrodes 112A~112D have respective electrode surfaces, each of which is in contact with the vertical conductor 130.

As shown in FIGS. 2B and 2C, the vertical conductor 130 penetrates through the semiconductor chip layers 110A-110D at least in part. In the described embodiment, the number of semiconductor chip layers through which the vertical conductor 130 is formed is n, which corresponds to the order of the rotational symmetry.

FIGS. 3A and 3B illustrates an enlarged top view and a perspective view of the stacked semiconductor chip assembly 100 around one vertical conductor 130 when the vertical conductors 130 are transparently shown, respectively.

As shown in FIGS. 3A and 3B, the electrode surfaces of the vertically arranged electrodes 112A-112D are arranged spirally (or helically) at respective levels relating to the semiconductor chip layers 110A-110D, more specifically, the levels of the surfaces of the semiconductor chip layers 110A-110D, resulting in a spiral (or helical) staircase-like structure.

As illustrated in FIG. 3B, the semiconductor chip layers 110A-110D have via holes 128A-128D formed therethrough, respectively. The via holes 128A-128D of the semiconductor chip layers 110A-110D overlap and communicate with each other, and have different hole shapes so as to form the through hole 128 having the spiral or helical staircase-like structure. The electrode surfaces of the vertically arranged electrodes 112A-112D are exposed within the through hole 128.

Note that, in the particular embodiment shown in the series of FIGS. 1A, 1B, 1C and 1D, FIGS. 2A, 2B and 2C, and FIGS. 3A and 3B, the number of the semiconductor chip layers 110 is four. However, the number of the semiconductor chip layers 110 may not be limited. In a particular embodiment, the number of the semiconductor chip layers 210 may be m multiplied by n where m represents the number of units when assuming that one unit contains n semiconductor chip layers, which makes the electrode surfaces one round around the center of the through hole 128 in the horizontal plane. When m is two or more, the electrode surfaces of every vertically arranged electrode would not be seen from the top. In this case, the vertically arranged electrodes 112 are arranged such that the electrode surfaces of every vertically arranged electrode 112 for each unit can be seen at least partially from the top when assuming that there is no conductive material of the vertical conductor 130 and no upper unit(s).

Also note that there may be other structural or functional element such as a base substrate on which the stacked semiconductor chip assembly 100 is stacked, a mother board on which the stacked semiconductor chip assembly 100 is mounted, and a surface wiring layer formed on the stacked semiconductor chip assembly 100, etc.

The aforementioned stacked semiconductor chip assembly 100 can be assembled using wafer-to-wafer stacking process. In the wafer-to-wafer stacking process, a plurality of semiconductor wafers is aligned and then bonded, followed by the singulation of individual chip stacks.

Figure 4:
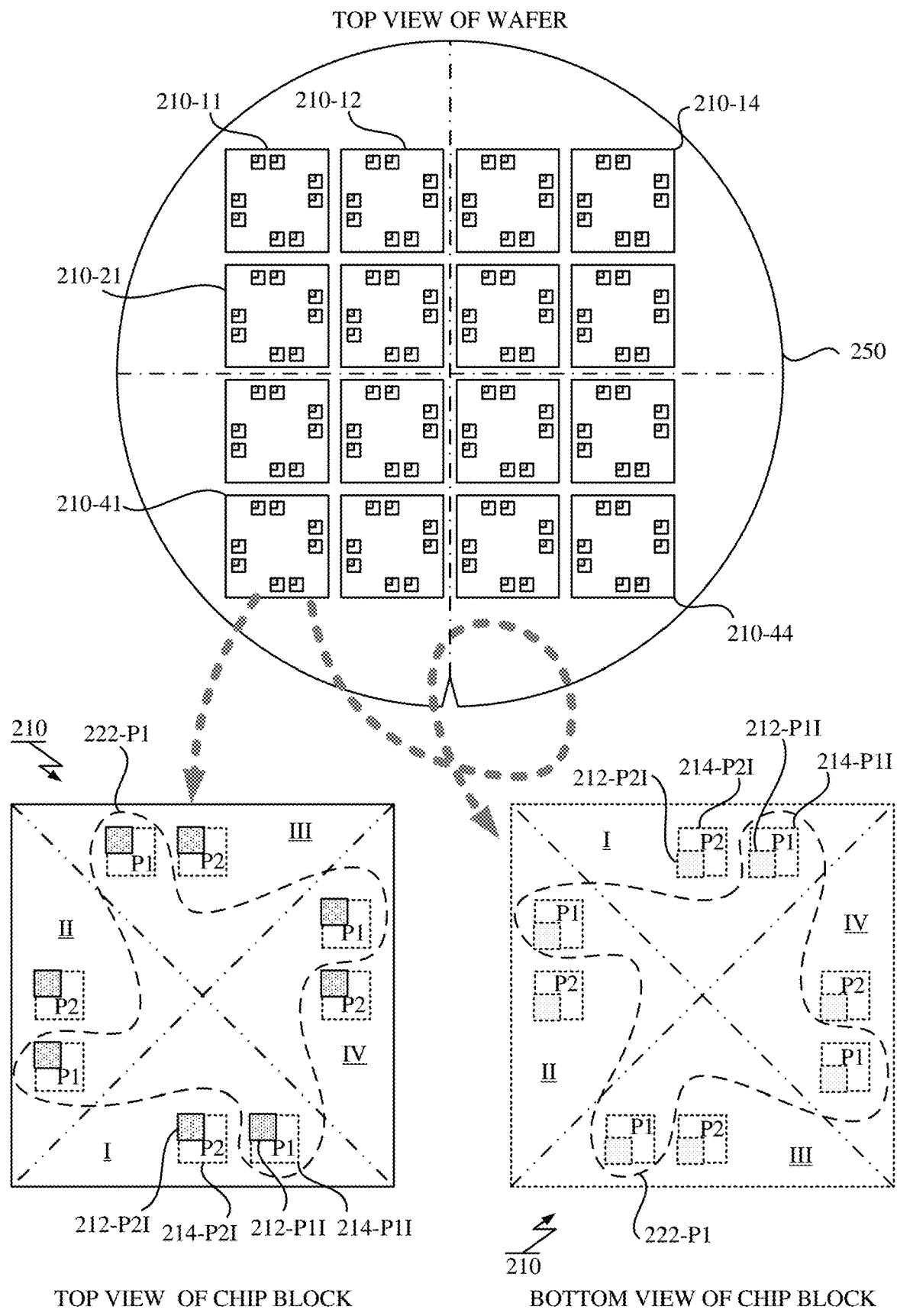
FIG. 4 illustrates a schematic of a semiconductor wafer that can be used for fabricating the stacked semiconductor chip assembly according to an embodiment of the present invention.

FIG. 4 illustrates a schematic of a semiconductor wafer 250 that can be used for fabricating the stacked semiconductor chip assembly 100. The semiconductor wafer 250 shown in FIG. 4 corresponds to a chip structure according to an embodiment of the present invention.

As shown in FIG. 4, the semiconductor wafer 250 includes an array of semiconductor chip blocks 210, each of which corresponds to one semiconductor chip or die assembled in the stacked semiconductor chip assembly 100 after the singulation. Note that the semiconductor wafer 250 shown in FIG. 4 may have been subjected to appropriate thinning process such as back-grinding so as to have appropriate thickness. The semiconductor wafer 250 corresponds to each semiconductor chip layer 110 shown in FIGS. 1B and 1D while including the array of the semiconductor chip blocks 110 arranged in a novel manner, instead of including the single chip block.

In similar to the stacked semiconductor chip assembly 100 and the semiconductor chip layer 110, the semiconductor chip blocks 210 in the array is designed to have an identical shape having rotational symmetry. The shape of each semiconductor chip block 210 is identical to a unit shape of tessellation, more specifically, regular tessellation, including square, regular triangle and regular hexagon. In an embodiment, each semiconductor chip block 210 has an approximately square shape having 4-fold rotational symmetry, as shown in FIG. 4. Note that the shape of the semiconductor chip blocks 210 has not been actually shaped yet before the singulation. However, it is emerged in the integrated circuit pattern of the semiconductor chip blocks 210.

The array is two dimensional. In the described embodiment shown in FIG. 4, the number of columns and the number of rows in the array are both four, for convenience. Thus, there are 16 semiconductor chip blocks 210-$ij$ (i=1, 2, 3, 4; j=1, 2, 3, 4). However, the size of the array is not limited to 4×4. In other embodiments, the size of the array may be 1×1, 2×2, 3×3, 6×6, 8×8, 16×16, and the like as long as the array presents the same rotational symmetry as the shape of the semiconductor chip blocks 210 around the center of the array. Note that the center of the array is indicated by two crossed chain lines.

In FIG. 4, top and bottom views of a representative semiconductor chip block 210 are also shown. Each semiconductor chip block 210 has a plurality of areas 214 where formation of a via hole through the semiconductor wafer 250 is allowed, respectively.

Each semiconductor chip block 210 further includes a plurality of electrodes 212 formed thereon at respective positions of the areas 214. The plurality of the electrodes 212 can be divided into a plurality of groups (e.g., P1 encompassed by a dashed loop line 222-P1). The different functions may be assigned to each of the groups of the electrodes 212 and the plurality of the electrodes 212 in the same group is assigned the same function. Thus, there are four electrodes 212 for each function, totally eight electrodes in the particular embodiment shown in FIG. 4. Note that other conductive pattern such as wiring metal is omitted from the drawing for convenience. Nonetheless, note that any conductive pattern may be kept out from the remaining of the areas 214 where the electrodes 212 are not formed. Also note that there is no need for the conductive pattern other than the electrodes 212 to have any symmetry.

In similar to the stacked semiconductor chip assembly 100, the top and bottom surface of each semiconductor chip block 210 can be divided into a plurality of regions where one set of via hole areas for different functions (e.g. 214-P1I, 214-P2II) are prepared, respectively. The number of the regions corresponds to the order of the rotational symmetry of the shape of the semiconductor chip blocks 210. In the described embodiment shown in FIG. 5, there are four regions (y=I, II, III, IV) delimited by a two-dot chain diagonal lines. Note that the way of delimiting the surface of the semiconductor chip block 210 is not limited as long as the regions delimited having the same rotational symmetry as the shape of the semiconductor chip blocks 210.

The layout of the via hole area 214 have also the same rotational symmetry as the shape of the semiconductor chip blocks 210. More specifically, the positions of the via hole areas 214 in each function and relative positional relationships between the via hole area 214 having different functions have also the same rotational symmetry the shape of the semiconductor chip blocks 210. In contrast, the positions of the electrode surfaces of the electrodes 212 for each function have translational symmetry in similar to the geometries of the vertically arranged electrodes 112A~112D shown in FIG. 1B.

Although not shown in FIG. 4, the semiconductor wafer 250 may further include an insulating adhesive layer formed on the top or bottom surface thereof, which may be used for subsequent stacking process. The insulating adhesive layer can be divided into a plurality of portions corresponding to the array of the semiconductor chip blocks 210.

In one particular embodiment, each portion of the insulating adhesive layer may have flat form when through hole area of the insulating adhesive layer is removed after stacking. In other particular embodiment, each portion of the insulating adhesive layer may have a plurality of openings located at positions of the via hole areas 214 when through hole areas of the insulating adhesive layer is removed before stacking.

Figure 5:
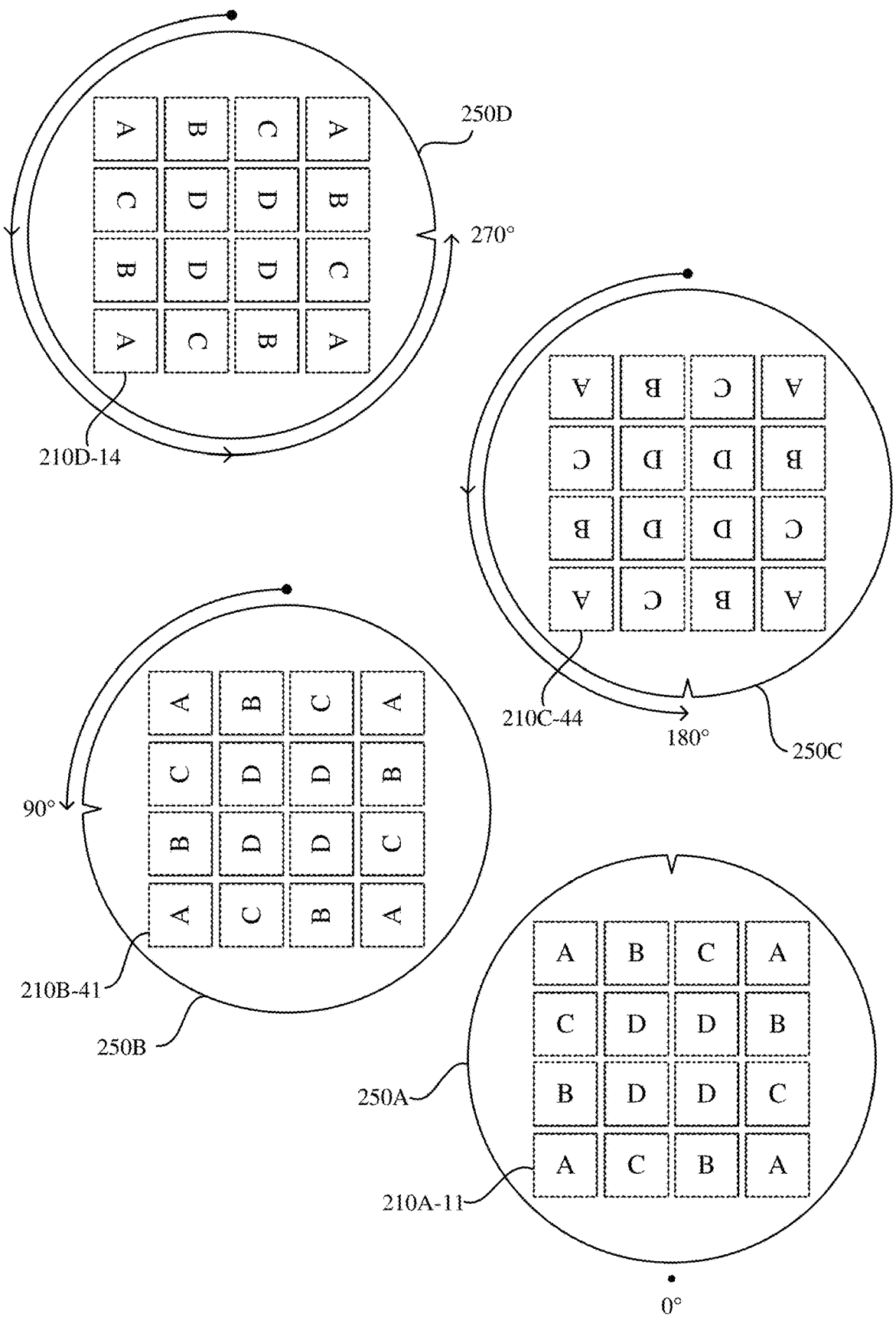
FIG. 5 illustrates a way of stacking a plurality of semiconductor wafers according to the embodiment of the present invention.

FIG. 5 illustrates a way of stacking a plurality of semiconductor wafers 250. The semiconductor wafer 250 shown in FIG. 4 can be used regardless of wafer stacking level. During the fabrication process of the stacked semiconductor chip assembly 100, the plurality of the semiconductor wafers 250A~250D are stacked sequentially with rotations, as indicated by the notch thereof in FIG. 5, which represents an orientation of the semiconductor wafer 250. Note that each semiconductor wafer 250 in FIG. 5 is shown upside down in comparison with FIG. 4 since the through hole is formed into the stacked wafers 250A~250D from the back side.

In FIG. 5, letters "A", "B", "C" and "D" are labelled to four semiconductor chip blocks 210 in each quadrant, respectively. The semiconductor chip blocks 210 given the same letter in the four quadrants have a relationship of rotational symmetry around the center of the array. As illustrated in FIG. 5, the array of the semiconductor chip blocks 210 for each semiconductor wafer 250 are arranged in the manner of the rotational symmetry such that each chip block (one given the letter "A", "B", "C" or "D" in one quadrant) overlaps with other symmetrically located chip block (one given the same letter in other quadrant) when a rotation operation around the center of the array is applied.

Thus, the stacking of one wafer (e.g., 250B) onto other wafer (e.g., 250A) can be performed such that each semiconductor chip block 210 of one wafer (e.g., 210B-41) overlaps with a symmetrically located semiconductor chip block 210 of other wafer (e.g. 210A-11).

The rotation operation around the center of the array with respect to a base position (e.g. the bottom wafer 250A) is a rotation with $360/n*i$ (i=1, . . . , n−1) degrees around the center of the array where n denotes the order of the rotational symmetry. In the described embodiment shown in FIG. 5, n is four and the angle of the rotations are 90, 180 and 270 degrees with respect to the base position (i.e., 0 degree), respectively.

By stacking the plurality of the semiconductor wafers 250A~250D with appropriate rotation operations (90, 180, 270 degrees), four chip blocks of different wafer levels (e.g., 210A-11, 210B-41, 210C-44, 210D-14) are overlapped and stacked for each element's position in the array, result in an array of stacks of overlapping chip block 210.

Figure 6:
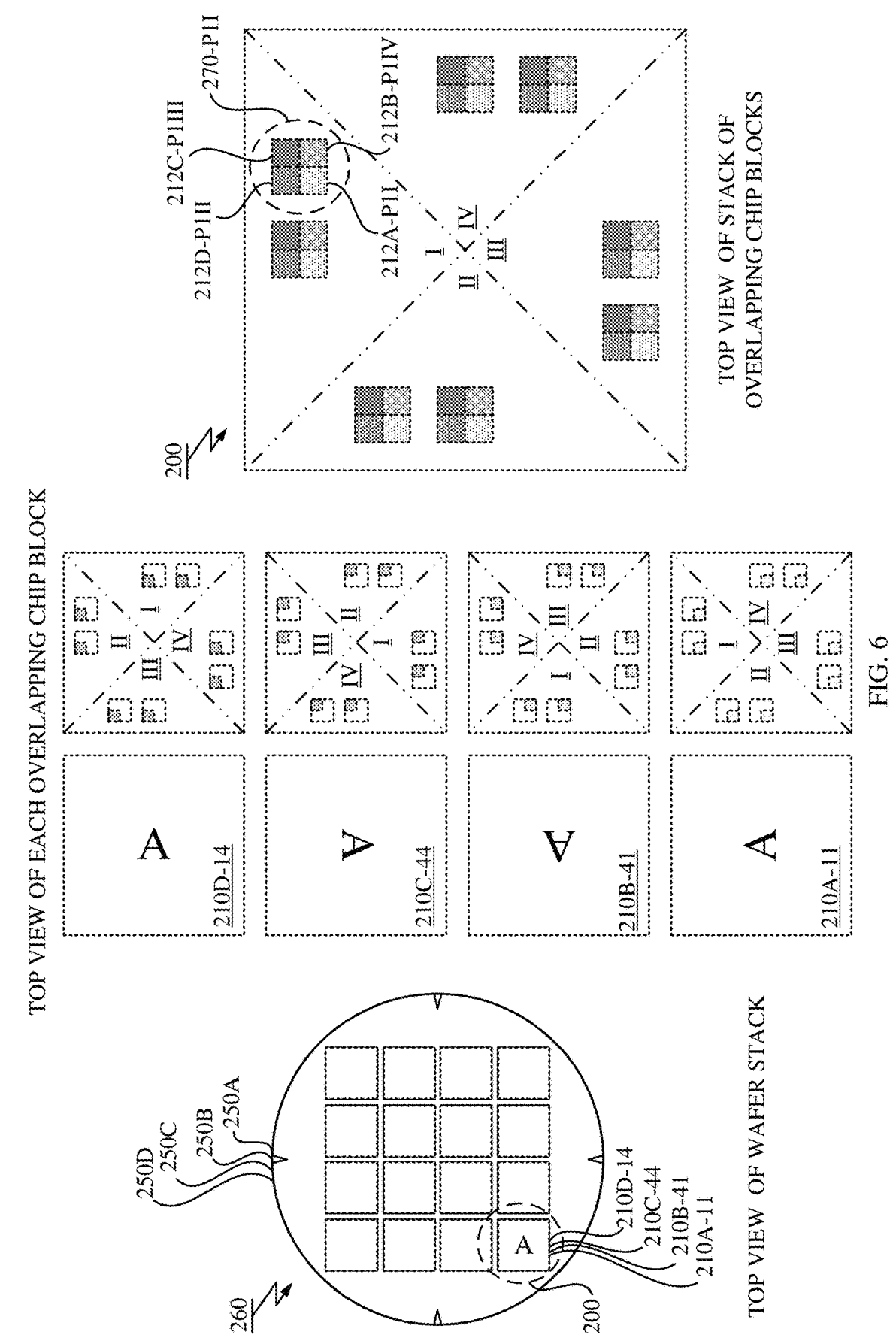
FIG. 6 illustrates the way of stacking the plurality of the semiconductor wafers focusing on one stack of overlapping chip blocks according to the embodiment of the present invention.

FIG. 6 illustrates a way of stacking the plurality of the semiconductor wafers 250, focusing on one stack 200 including the overlapping chip blocks 210A-11, 210B-41, 210C-44, 210D-14.

In FIG. 6, a top view of a whole stacked wafer assembly 260 and a top view of each of the overlapping chip block 210A-11, 210B-41, 210C-44, 210D-14 are shown. Note that the outlines of the electrodes are illustrated by dot lines since the electrodes are formed on the back surface of each overlapping chip block 210.

As illustrated in FIG. 6, in response to the rotation operation around the center of the array, the orientation of each semiconductor chip block 210 is rotated as if it is subjected to the rotation operation around its center. Hence, focusing on every element's position in the array, an array of stacks 200 of overlapping chip blocks having relative rotation angles is configured in the stacked wafer assembly 260. Each stack 200 corresponds to the stacked semiconductor chip assembly 100 shown in FIG. 1A~1D.

In FIG. 6, a top view of the stack 200 of the overlapping chip blocks 210 is further shown. In similar to the stacked semiconductor chip assembly 100, the top and bottom surface of the stack 200 can also be divided into a plurality of regions. There are four regions (I, II, III, IV) delimited by a two-dot chain diagonal lines, each of which has one set of groups of vertically aligned electrodes 210 having different functions (P1, P2).

Each stack 200 holds a plurality of groups 270 of vertically arranged electrodes 212A~212D (more specifically a group 270-P1I consisting of electrodes 212A-P1I, 212B-P1IV, 212C-P1III, 212D-P1II) that are shifted in the horizontal plane.

Thus, referring to FIG. 4 in conjunction with FIG. 6, for each semiconductor chip block 210 shown in FIG. 4, the electrodes 212 are arranged such that each electrode surface (e.g. 212-P1I) is configured to be adjacent to other one of the electrode surfaces (e.g., 212-P1IV) with a certain shift in horizontal plane when the rotation operation around the center of the semiconductor chip block 210 is applied to the other one of the electrode surfaces (212-PIV). In response to the rotation operation around the center of the array, the position of each electrode 212 is rotated as if it is subjected to the rotation operation around the center of the via hole area 214.

Although not shown in FIG. 6, each stack 200 of the semiconductor chip blocks 210 may further hold a corresponding portion of each of the one or more insulating adhesive layers interposed between the chip blocks 210, each of which bounds adjacent two of the chip blocks 210. In one or more particular embodiments, each portion of the insulating adhesive layer may have flat form or a plurality of openings depending on the process flow.

Referring to a series of FIGS. 7A-7H, an assembling process for fabricating a stacked semiconductor chip assembly according to an embodiment of the present invention is described. FIGS. 7A-H illustrate cross-sectional views of a structure obtained at each step of the assembling process. Note that FIGS. 7A, 7C, 7E, 7G (left hand side) and FIGS.

7B, 7D, 7F, 7H (right hand side) are cross-sectional views corresponding to different cross-sections similar to that shown in FIG. 2A with indication of "B" and "C".

Figure 7A:
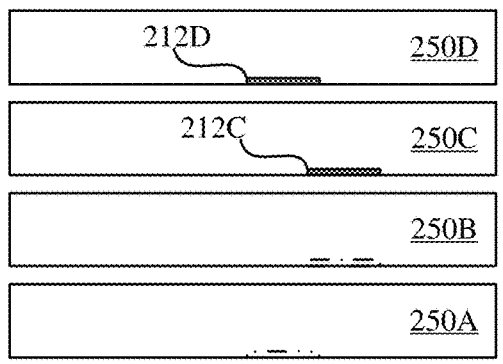
FIGS. 7A-7H illustrate cross-sectional views of a structure obtained at each step of an assembling process according to an embodiment of the present invention.
Figure 7B:
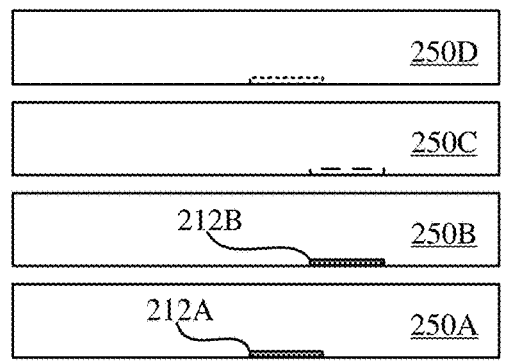

With reference to FIGS. 7A and 7B, the assembling process includes a step of preparing the plurality of the semiconductor wafers 250A~250D shown in FIG. 4, each of which includes the array of the semiconductor chip blocks 210. Each semiconductor wafer 250 may have the electrode 212 formed on the surface thereof.

Figure 7C:
Figure 7D:
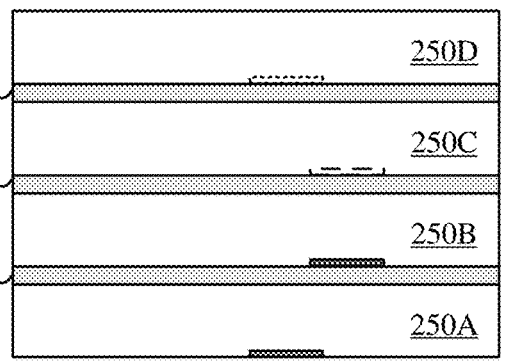

With reference to FIGS. 7C and 7D, the assembling process also includes a step of sequentially stacking the plurality of the semiconductor wafers 250A~250D with rotations so as to configure the array of the stacks 200 of the overlapping chip blocks 210 described in FIG. 5 and FIG. 6. The upper semiconductor wafer (e.g. 250B) is placed on the lower semiconductor wafer (e.g. 250A) such that the top surface of the upper semiconductor wafer (e.g. 250B) on which the electrode 212B is formed is bonded to the back surface of the lower semiconductor wafer (e.g. 250A). As described with reference to FIG. 6, the step of stacking of the semiconductor wafers 250 may be performed such that the electrode surfaces of the vertically arranged electrodes (212A-P1I, 212B-P1IV, 212C-P1III, 212D-P1II) in each group are arranged so as to make one round in the horizontal plane.

With further reference to FIGS. 7C and 7D, the assembling process may include a step of bonding the plurality of the semiconductor wafer 250A~250D with one or more interlayer insulating adhesive layers 202B~202D interposed therebetween. In a particular embodiment, insulating adhesive is applied onto the top surface of the upper semiconductor wafer (e.g. 250B) and then the upper semiconductor wafer (e.g. 250B) with an insulating adhesive layer (e.g., 202B), which may or may not include an opening, is placed on the lower semiconductor wafer (e.g. 250A), followed by curing.

Figure 7E:
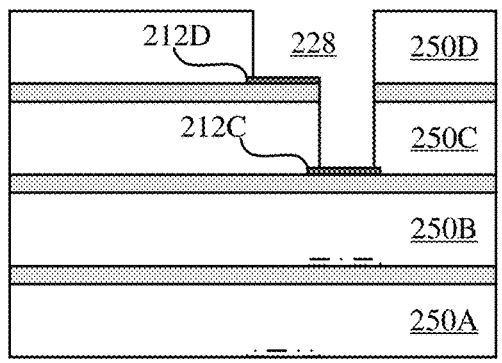
Figure 7F:
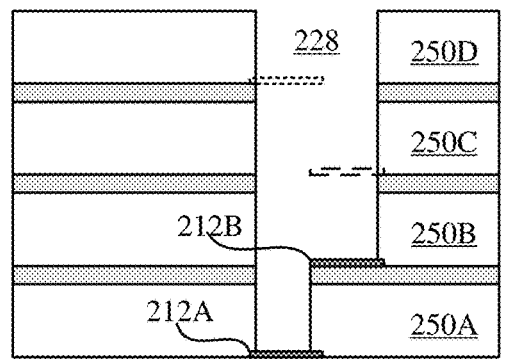

With reference to FIGS. 7E and 7F, the assembling process includes a step of forming a through hole 228 into the plurality of the semiconductor wafer 250A~250D at least in part so as to expose electrode surfaces of the vertically arranged electrodes 212A~212D. The step of forming of the through hole 228 is performed by etching (e.g., reactive ion etching (RIE) or other dry etching technique) and/or laser processing.

In one particular embodiment where the insulating adhesive layer 202 does not have openings for through hole 228 before stacking, the semiconductor wafers 250A~250B and the insulating adhesive layers 202B~202D can be drilled by the laser processing efficiently. In other particular embodiment where the insulating adhesive layer 202B~202D may have a plurality of openings, the semiconductor wafers 250 can be drilled by the etching efficiently. During the hole formation, the electrode surface of each electrode 212A~212D is configured to work as a stopper against hole formation.

Figure 7G:
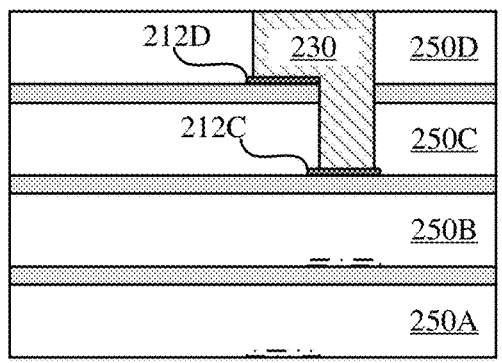
Figure 7H:
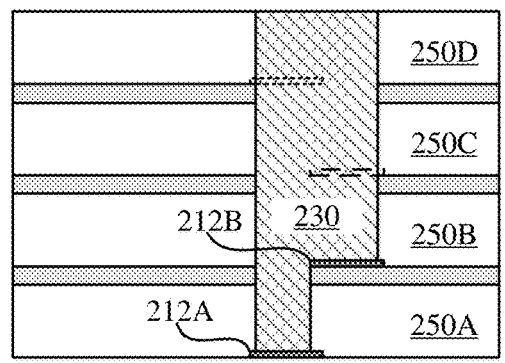

With reference to FIGS. 7G and 7H, the assembling process includes a step of filling the through hole 228 with conductive material 230. The step of filling the through hole 228 may be performed such that the conductive material 230 filled in each through hole is in contact with the respective electrode surfaces of the vertically arranged electrodes 212A~212D. The step of filling the through hole 228 may be performed by IMS (Injection Molded Soldering) technology.

In the IMS process, a molten solder is injected into the through hole 228 under a vacuum or reduced pressure condition by using a fill head that traverses the surface of the stacked wafer assembly 260, and solidified in the through hole 228. The fill head includes a reservoir of the molten solder and a slot through which the molten solder is injected into the through hole 228.

More specifically, the step of filling the through hole 228 may include a plurality of sub-steps. As shown in FIGS. 7C and 7D, after the hole formation step, all electrodes 212A~212D can be seen through the through hole 228 when viewing from normal direction with respect to the semiconductor wafer 250. Upon opening the through hole 228 through the stacked semiconductor chip layers 250A~250D, an inner surface of the through hole 228 may be coated with an insulation material (e.g., polymer) so as to insulate a sidewall of the semiconductor wafers 250. The coating of the insulation material can be performed by using conventional technique such as vapor deposition polymerization.

Then, portions of the insulation material deposited on the electrodes 212A~212D may be etched back by conventional anisotropic etching so as to expose electrode surfaces. At this point, the though hole 228 may have plural sections, each of which corresponds to each semiconductor wafer 250 and has terraces exposing corresponding electrodes (e.g., upper electrodes 212B~212D) or an inner bottom surface exposing the corresponding electrode (e.g., the bottom electrode 212A).

The conductive material 230 are filled into the though hole 228 to form the vertical conductor. Note that the filling step can be done by injection molded solder (IMS). In this case, there is no need to perform expensive CMP (Chemical Mechanical Polishing). IMS is cost effective. However, plating or other technique may also be contemplated. In other embodiment where the filling step is done by plating, seed sputtering, via fill plating and removal of conductive material deposited on the surface by CMP are subsequently performed. The conductive material can be deposited by via fill plating process on the inner surface of the hole 228 to form the vertical conductor 130.

After the filling or depositing step, the vertical conductor 230 can be seen when viewed from above, while all electrodes 212A~212D are covered by the conductive material.

Such spiral or helical staircase like structure shown in FIGS. 7E-7H would enable the stacked chip assembly 100 to have reliable contact between the vertical conductor 230 and the electrodes 212A~212D of the chip layers 250A~250D.

Figure 8:
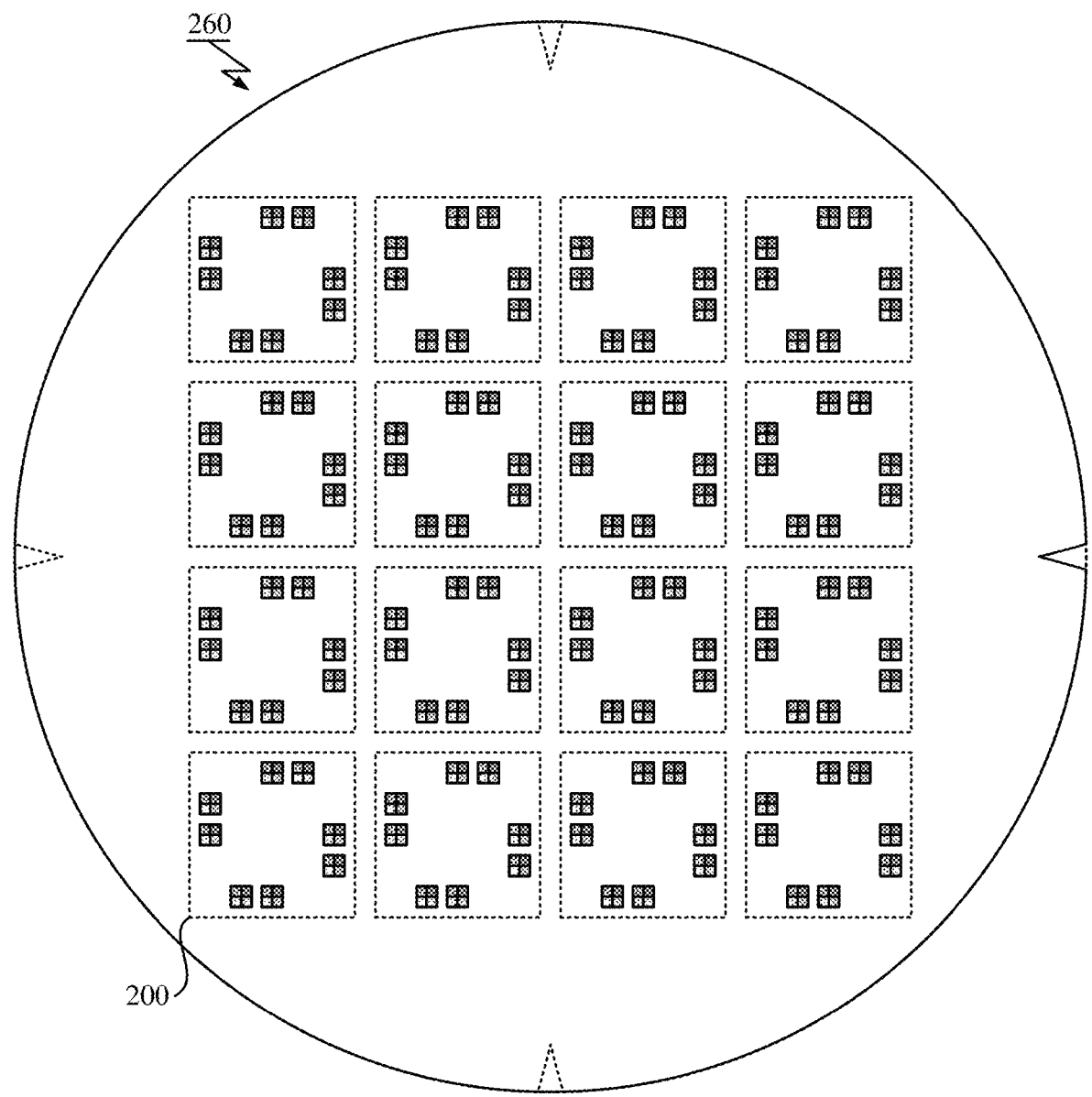
FIG. 8 illustrates a top view of a stacked wafer assembly without vertical conductors according to the embodiment of the present invention.

FIG. 8 illustrates a top view of the stacked wafer assembly 260 when the vertical conductors 230 are transparently shown. In one embodiment, the stacked wafer assembly 260 having the array of the stacks 200 of the overlapping chip blocks 210 in a form of wafer (or panel) as shown in FIG. 8 may be provided to the next in the production chain.

Figure 9:
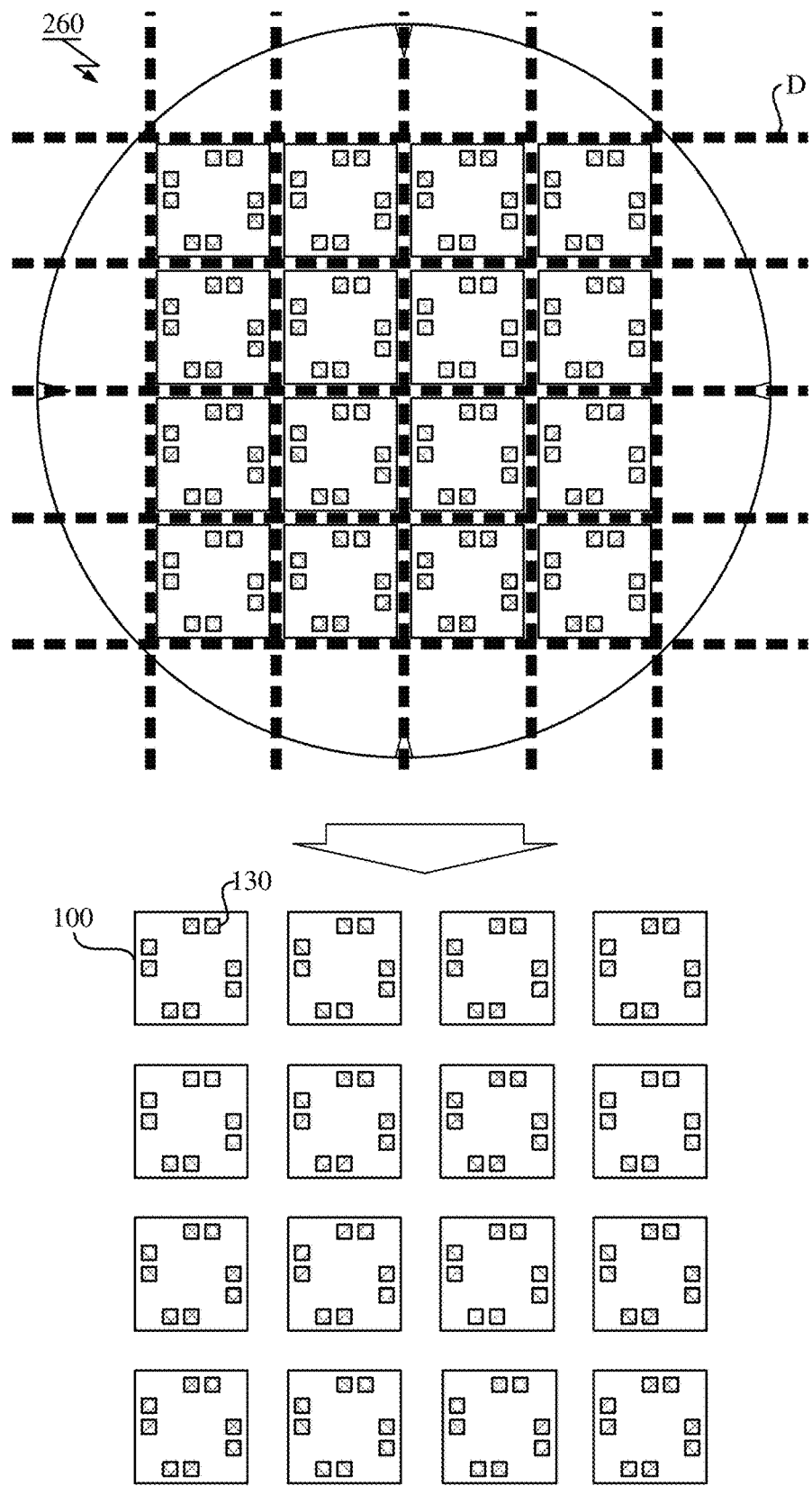
FIG. 9 illustrates a way of dicing the stacked wafer assembly into a plurality of stacked semiconductor chip assemblies according to the embodiment of the present invention.

FIG. 9 illustrates a way of dicing the stacked wafer assembly 260. As shown in FIG. 9, the assembling process may further include a step of dicing the stacked wafer assembly 260 into a plurality of stacked semiconductor chip assemblies 100, each of which corresponds to one stack 200 of the overlapping chip blocks 210 shown in FIG. 6.

Since the plurality of the semiconductor chip blocks 210 are stacked without any extra horizontal shift, the width of the dicing channel D can be minimized to the same extent as single wafer, thereby making it possible to effectively utilize the area of the semiconductor wafer 250 as possible. The fabrication cost of the stacked semiconductor chip assembly 100 would decrease as chips per wafer (CPW) increases.

Note that the way of dicing may depend on the shape of each individual chip block 210. When n is 4 and each chip block has the square shape, it is not required that dicing tool is adapted for special shape other than rectangular shape. Standard dicing tool can be used without any specific adaptation.

In other embodiment, the stacked semiconductor chip assemblies 100 singulated from the whole stacked wafer assembly 260 by the dicing step can be provided to the next in the production chain.

Figure 10:
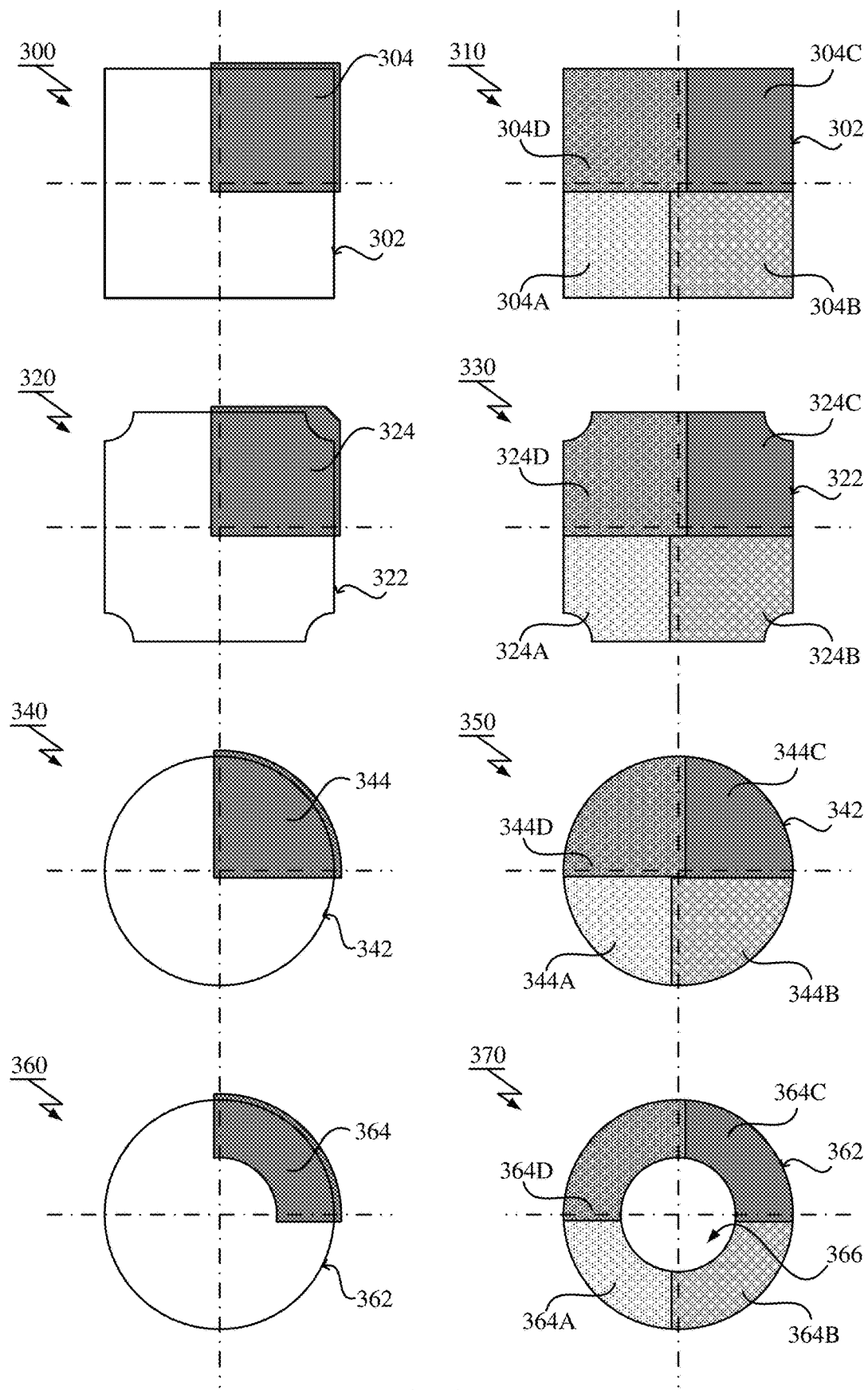
FIG. 10 illustrates a variety of designs of through hole and electrodes according to one or more particular embodiments of the present invention.

With reference to FIG. 10, a variety of designs of through hole and electrodes according to one or more particular embodiments of the present invention are illustrated. In FIG. 10, there are schematics of four exemplary designs 300, 320, 340, 360 and corresponding top views 310, 330, 350, 370 showing the arrangement of the electrode surfaces seen through the through hole when the vertical conductors are transparently shown.

The first exemplary design 300 and the top view 310 correspond to the aforementioned particular embodiment where n=4. Both of the though hole 302 and the electrode 304 have a square shape. The electrode 304 is formed within the through hole 302 partially and may have a size slightly larger than ¼ of the size of the through hole 302 in consideration of placement accuracy of stacking. The whole of the though hole 302 is covered by at least either of the electrodes 304A~304D.

The second exemplary design 320 and the top view 330 show a variation where n=4. Both of the though hole 322 and the electrode 324 have a square shape but its corners are rounded or chipped. The electrode 324 may also have a size slightly larger than ¼ of the size of the through hole 322. The whole of the though hole 322 is covered by at least either of the electrodes 324A~324D.

The third exemplary design 340 and the top view 350 show other variation. Both of the though hole 342 and the electrode 344 have a circular shape. The electrode 344 may have a size slightly larger than ¼ of the size of the through hole 342. The whole of the though hole 342 is covered by at least either of the electrodes 344A~344D.

The fourth exemplary design 360 and the top view 370 show another variation. Both of the though hole 362 and the electrode 364 have a hollow circular shape. The electrode 344 may also have a size slightly larger than ¼ of the size of the through hole 342. In contrast to the aforementioned designs 300, 320 and 340, there are a central portion 366 of the though hole 362 that is not covered by any one of the electrodes 364A~364D.

As shown in FIG. 10, the shapes of the through hole and/or the electrode are not limited to specific shape. It can be circle or other polygon having n-fold rotational symmetry (e.g., 90 degree when n=4). Also, the shape of the electrode is not limited to square as well. However, in every case, the electrode surfaces of the vertically arranged electrodes 304A~304D, 324A~324D, 344A~344D, 364A~364D are arranged so as to make one round in the horizontal plane, i.e., covering 360 degree.

As noted above, there are mainly two cases concerning the way of forming an opening into the insulating adhesive layer. One is a case where the opening is fabricated into the insulating adhesive layer 202 before the stacking step. Another is a case where the removal of the via hole area of the insulating adhesive layer 202 is performed after the stacking step.

The fourth exemplary design 360 can be employed in the latter case where the removal is performed before stacking, in comparison with the third exemplary design 340, which is similar to the design 360 in that it is based on a circle. The fourth exemplary design 360 is superior to the third exemplary design 340 in that generation of voids can be reduced as will be described below.

Hereinbelow, referring to FIG. 11 in conjunction with FIG. 10, a technique capable of avoiding generation of voids in the through hole according to a particular embodiment of the present invention will be described.

Figure 11:
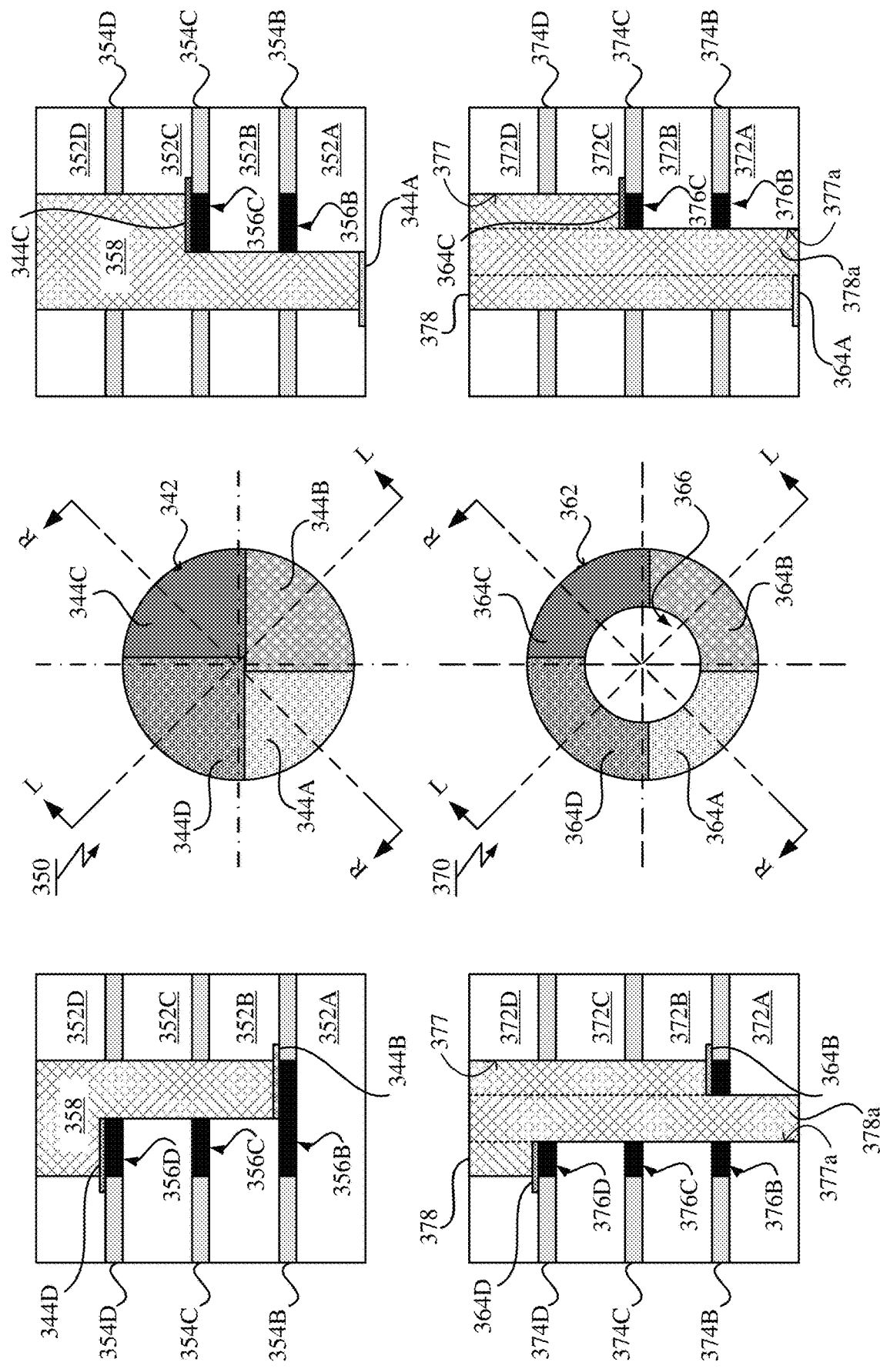
FIG. 11 describes technique capable of avoiding generation of voids in the through hole according to a particular embodiment of the present invention.

In FIG. 11, there are top view of electrode arrangement and two cross-sectional views around one vertical conductor for each of the exemplary designs 340, 360. The cross-sectional views of the left hand side correspond to cross-sections indicated by "L", whereas the cross-sectional views of the right hand side correspond to cross-sections indicated by "R".

For the exemplary design 340, there are four wafers 352A~352D; four electrodes 344A~344D, each of which is formed on the surface of each wafer 352; three insulating adhesive layers 354B~354D interposed between the wafers 352A~352D; and the vertical conductor 358 penetrates through the four wafers 352A~352D.

As shown in FIG. 11, since the removal of the via hole portion in the insulating adhesive layer 354 is performed before stacking, there are removed spaces 356B~356D in the insulating adhesive layers 354B~354D. Since such removed space 356 would induce void generation during the hole filling process even though the hole filling process is performed under the vacuum or reduced pressure condition.

For the exemplary design 360, there are also four wafers 372A~372D; four electrodes 364A~364D, each of which is formed on the surface of each wafer 372; three insulating adhesive layers 374B~374D interposed between the wafers 372A~372D; and the vertical conductor 378 penetrates through the four wafers 372A~372D.

In contrast to the exemplary design 340, the vertical conductor 378 penetrates completely through the four wafers 372A~372D at the center portion. As described above, each electrode surface 364A~364D works as a stopper against the hole formation. But the electrode surface 364 has a shape enabling formation of the center portion 378a of the vertical conductor 370 (also center portion 377a of the through hole 377) penetrating through the plurality of the wafer 372A~372D. The center portion 378a (also 377a) is a portion not covered by any of the electrode surfaces.

There are also removed spaces 376B-376D in the insulating adhesive layers 374B~374D. However, in contrast to the exemplary design 340, the length (depth) of the removed spaces 376B~376D may be shortened. Hence, the generation of the voids during the hole filling process is expected to be reduced.

In the case where the portion of the insulating adhesive layer 374 located at the position of the through hole 377 is removed before stacking, the shape of the adhesive opening can be optimized at each level. However, in such a case, different mask is required to be prepared for each staking level, increasing the cost and the complexity of the production process. If all through hole areas are removed with a single mask design, it would cause a void underneath the electrode as described above. By employing the exemplary designs 360 where the part of the through hole area is not covered by any one of the electrodes, the conductor filling process becomes easier with even distance from the through hole to the edge of the vacant space underneath electrode.

As described above, the number of the semiconductor chip layers 110 or wafers 250 may not be limited to four. In a particular embodiment, the number of the semiconductor chip layers 100 or wafers 250 to be stacked may be m multiplied by n where m represents the number of units when assuming that one unit contains n semiconductor chip layers 210 or wafer 250.

With reference to FIGS. 12A, 12B and 12C, an assembling process for a stacked semiconductor chip assembly having eight layers according to a particular embodiment of the present invention is described. FIGS. 12A, 12B and 12C illustrate cross-sectional views of a structure obtained at each step of the assembling process.

In this assembling process, the exemplary design 360 is employed. As shown in FIG. 12A, the assembling process may include a step of obtaining a plurality of stacked layer assemblies 400A, 400B by performing the steps shown in FIGS. 7A~7F repeatedly. Thus, the step of preparing of the plurality of the wafers (410A~410D or 410E~410H), the step of the stacking of the plurality of the wafer (410A~410D or 410E~410H) with insulating adhesive layers (412B~412D or 412F~412H), and the forming of the through hole 402A, 402B that penetrates through the stacked layer assemblies 400A, 400B completely are performed repeatedly m times (m=2 in the particular embodiment shown in FIG. 12A).

As shown in FIG. 12B, the assembling process may include further a step of stacking the plurality of the stacked layer assemblies 400A, 400B with an insulating adhesive layer (412E) such that the through holes 402A, 402B of the stacked layer assemblies 400A, 400B communicate with each other to form a through hole 422 formed through the stacked assembly structure 420.

As shown in FIG. 12C, the assembling process may include further a step of filling the through hole 422 to form a vertical conductor 424 formed through the stacked assembly structure 420. In this process, the filling of each through hole 402A, 402B is performed at once for the plurality of the stacked layer assemblies 400A, 400B.

Figure 13:
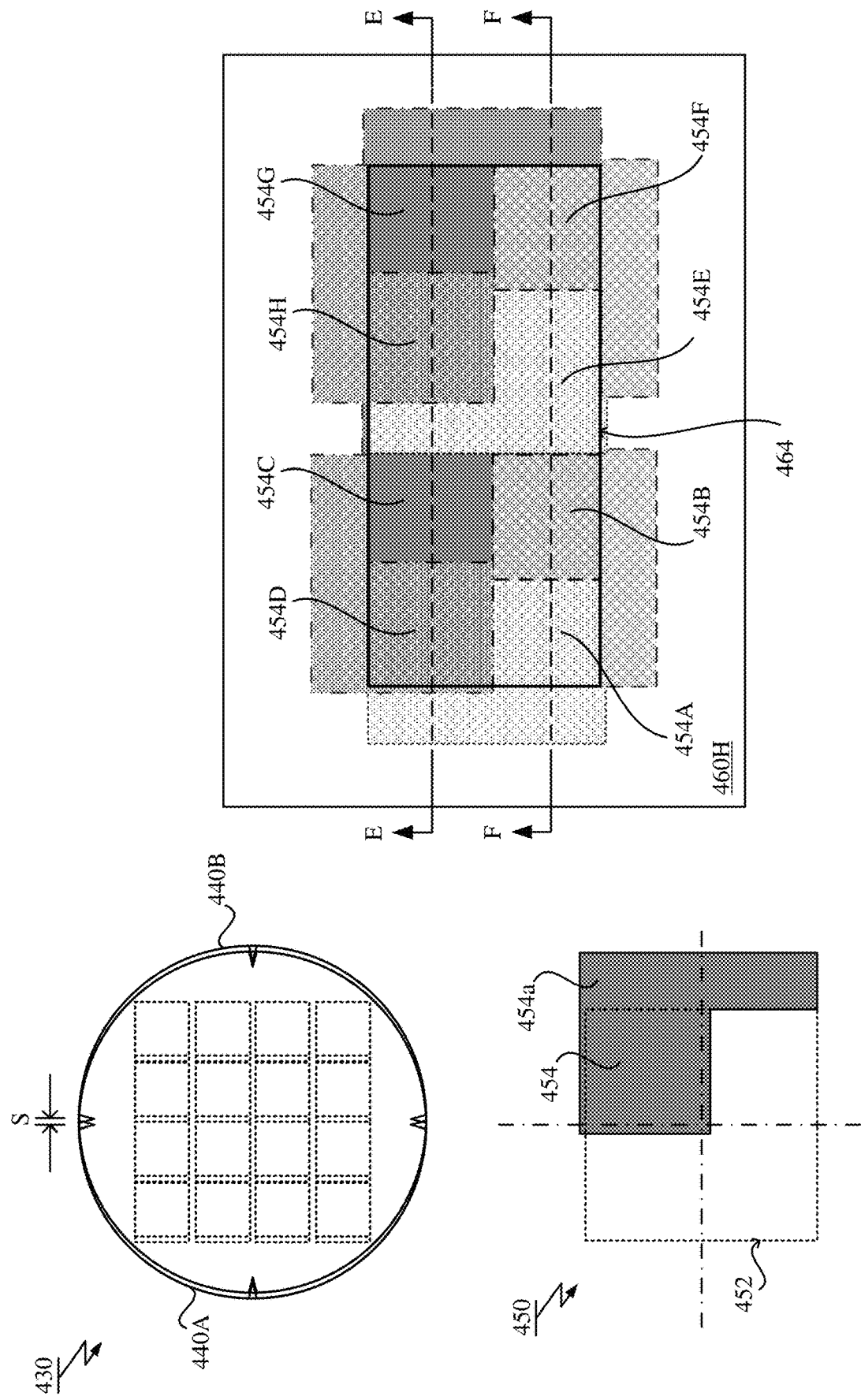
FIG. 13 illustrates an alternative assembling process for a stacked semiconductor chip assembly having eight layers according to other particular embodiment of the present invention.

With reference to FIG. 13 and FIGS. 14A and 14B, alternative assembling process for a stacked semiconductor chip assembly having eight layers according to a particular embodiment of the present invention is described. FIG. 13 illustrates an alternative assembling process for eight layers. FIGS. 14A and 14B illustrate cross-sectional views of a structure obtained at each step of the alternative assembling process.

In the alternative assembling process, an design 450 shown in FIG. 13 is employed, in which an electrode 454 has a tab or strap area 454a that extends outside region of an original through hole 452.

As similar to the embodiment shown in FIGS. 12A and 12B, the alternative assembling process may include a step of obtaining a plurality of the stacked layer assemblies 440A, 440B by performing the steps shown in FIGS. 7A~7D repeatedly. But the forming of the through hole is not performed for each assembly 440A, 440B. Thus, the step of preparing of the plurality of the wafers (460A~460D or 460E~460H) and the step of the stacking of the plurality of the wafer (460A~460D or 460E~460H) with insulating adhesive layers (462B~462D or 462F~462H) are performed repeatedly.

As shown in FIG. 13, the obtained assemblies 440A, 440B are stacked with a translational shift (horizontal shift without rotation) S. The amount of the shift S can be total size of the original through hole 452 pulse the tab or strap area 454a. Note that it is preferable to keep enough through hole pitch to the adjacent in some embodiments.

As shown in FIG. 13, the alternative assembling process may include a step of forming a though hole 464 penetrating though the stacked layer assemblies 440A, 440B in part such that every electrode surface of the electrodes 454A~454H exposes in the though hole 464. The actual size (width) of the though hole 464 is more than twice the size of the original through hole 452. Note that the surfaces of every electrodes 454A~454H can be seen at least partially from the top, as shown in FIG. 13.

As shown in FIGS. 14A and 14B, the alternative assembling process may include a step of filling the through hole 464 to form a vertical conductor 468 formed through the stacked assembly structure 430. In this method, the filling of the through holes 464A, 464B is performed at once for the plurality of the stacked layer assemblies stacked 440A, 440B.

Figure 12:
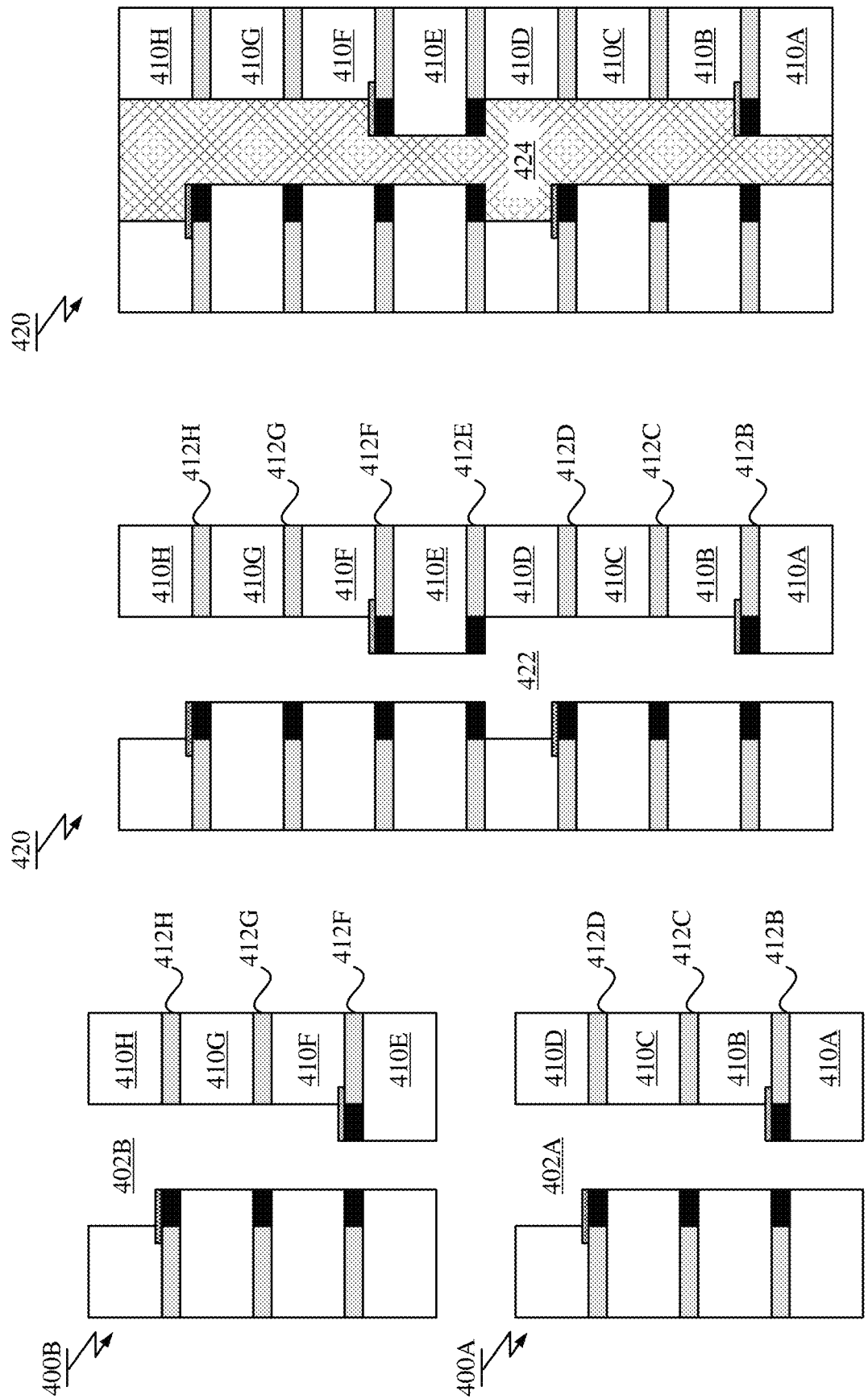
FIGS. 12A, 12B and 12C illustrate cross-sectional views of a structure obtained at each step of an assembling process for a stacked semiconductor chip assembly having eight layers according to a particular embodiment of the present invention.

The assembling process shown in FIG. 12 is superior to the alternative assembling process shown in FIG. 13 and FIGS. 14A and 14B in terms of chips per wafer (CPW) since the assembling process shown in FIG. 12 does not have negative effect on the width of the dicing channels.

With reference to FIGS. 15A, 15B, 15C and 15D, a way of fabricating a stacked semiconductor chip assembly with a regular triangle shape according to a particular embodiment of the present invention is described.

FIG. 15A shows a schematic of a semiconductor wafer 470 that can be used for fabricating the stacked semiconductor chip assembly having the regular triangle shape.

As shown in FIG. 15A, the semiconductor wafer 470 includes an array of semiconductor chip blocks 472, each of which corresponds to one semiconductor chip or die after the singulation. The semiconductor chip blocks 472 in the array may have a regular triangle having 3-fold rotational symmetry, as shown in FIG. 15A. Each semiconductor chip block 472 includes three areas 474 where formation of a via hole through the semiconductor wafer 470 is allowed, respectively; and three electrodes 476. Note that there is merely one function for which the electrodes and the via hole areas is depicted, for convenience. However, there may be two or more functions In the described embodiment shown in FIG. 15A, totally 24 semiconductor chip blocks 472 are tiling a plane with no overlaps. The number of rows in the array is four and the number of triangles in each of the rows is 5, 7, 7 and 5, respectively. However, the size of the array is not limited thereto. In other embodiments, the number of the rows may be 2 (e.g. 3+3), 6 (7+9+11+11+9+7), and the like, as long as the array presents the same rotational symmetry of the order 3.

FIG. 15A also illustrates a way of stacking a plurality of semiconductor wafers 470. The semiconductor wafer 470 shown in FIG. 15A can be used regardless of wafer stacking level. During the fabrication process, the plurality of the semiconductor wafers 470A-470C are stacked sequentially with rotations. The angle of the rotations are 120 and 240 degrees with respect to the base position (i.e., 0 degree), respectively.

By stacking the plurality of the semiconductor wafers 470A~470C with appropriate rotation operations (120, 240 degrees), three chip blocks 472 of different wafer levels are overlapped and stacked for each element's position in the array, result in an array of stacks 480 of overlapping chip blocks show in FIG. 15B.

FIG. 15B illustrates a way of stacking the plurality of the semiconductor wafers 470, focusing on one stack 480 of the overlapping chip blocks 472. As illustrated in FIG. 15B, in response to the rotation operation around the center of the array, the orientation of each semiconductor chip block 472 is rotated as if it is subjected to the rotation operation around its center. In FIG. 15B, a top view of the stack 480 of the overlapping chip blocks 472 is shown. In similar to the stacked semiconductor chip assembly 100 shown in FIG. 6, the top and bottom surface of the stack 480 can also be divided into a plurality of regions. There are three regions (I, II, III) delimited by a two-dot chain lines, each of which has one set of groups of vertically aligned electrodes 210 having different functions (merely P1 is shown in FIGS. 15A and 15B). Each stack 480 holds a plurality of groups of vertically arranged electrodes 476A~476C that are shifted in the horizontal plane.

FIGS. 15C and 15D illustrate enlarged cross-sectional views of the stack 480 around one vertical conductor. Note that the cross-sectional views shown in FIGS. 15C and 15D correspond to cross-sections indicated by "H" and "G" in the top view shown in FIG. 15B, respectively.

As shown in FIGS. 15C and 15D, the stack 480 may include a three wafer 470A~470C and two interlayer insulating adhesives 482B~482C interposed therebetween. The vertically arranged electrodes 476A~476C are located at respective levels of the surfaces of the wafer 470. The vertically arranged electrodes 476A~476C have respective electrode surfaces, each of which is in contact with the vertical conductor 484, resulting in a spiral or helical staircase-like structure.

Figure 16A:
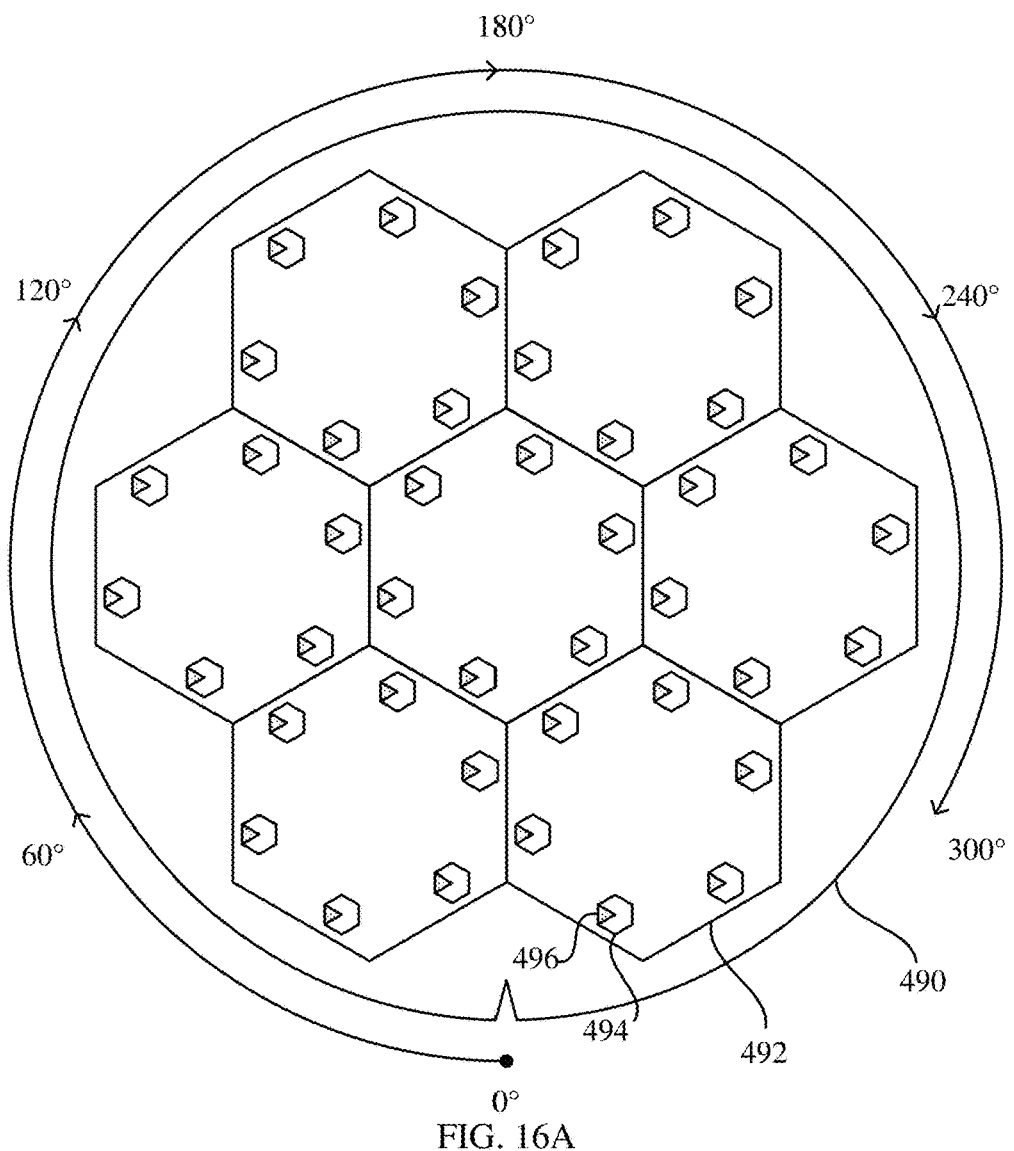
FIGS. 16A and 16B illustrates a way of fabricating a stacked semiconductor chip assembly with regular hexagon shape according to a particular embodiment of the present invention.

With reference to FIGS. 16A and 16B and FIGS. 17A and 17B, a way of fabricating a stacked semiconductor chip assembly with a regular hexagon shape according to a particular embodiment of the present invention is described. FIG. 16A shows a schematic of a semiconductor wafer 490 that can be used for fabricating the stacked semiconductor chip assembly having the regular hexagon shape.

As shown in FIG. 16A, the semiconductor wafer 490 includes an array of semiconductor chip blocks 492. The semiconductor chip blocks 492 in the array may have a regular hexagon shape having 6-fold rotational symmetry. Each semiconductor chip block 492 includes six via hole areas 494 where formation of a via hole through the semiconductor wafer 490 is allowed, respectively; and six electrodes 496. Note that there is merely one function for which the electrodes and the via hole areas is depicted, for convenience. However, there may be two or more functions.

In the described embodiment shown in FIG. 16A, totally 7 semiconductor chip blocks 492 are tiling a plane with no overlaps. The number of rows of the hexagon in the array is three and the number of hexagons in each of the rows is 2, 3 and 2, respectively. However, the size of the array is not limited thereto. In other embodiments, the number of the rows may be 1, 5 (3+4+5+4+3), and the like, as long as the array presents the same rotational symmetry of the order 6.

FIG. 16A also illustrates a way of stacking a plurality of semiconductor wafers 490. The semiconductor wafer 490 shown in FIG. 16A can be used regardless of wafer stacking level. During the fabrication process, the plurality of the semiconductor wafers 490A-490F are stacked sequentially with rotations. The angle of the rotations are 60, 120, 180, 240 and 300 degrees with respect to the base position (i.e., 0 degree), respectively.

Figure 16B:
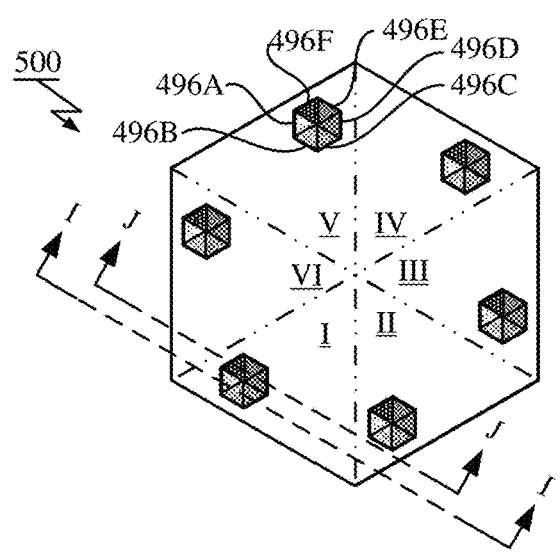

By stacking the plurality of the semiconductor wafers 490A~490F with appropriate rotation operations (60, 120, 180, 240, 300 degrees), six chip blocks of different wafer levels are overlapped and stacked for each element's position in the array, result in an array of stacks of overlapping chip block 500 show in FIG. 16B.

FIG. 16B illustrates a way of stacking the plurality of the semiconductor wafers 490, focusing on one stack 500 of the overlapping chip blocks 492. As illustrated in FIG. 16B, in response to the rotation operation around the center of the array, the orientation of each semiconductor chip block 492 is rotated as if it is subjected to the rotation operation around its center. In FIG. 16B, a top view of the stack 500 of the overlapping chip blocks 492 is shown. In similar to the stacked semiconductor chip assembly 100 shown in FIG. 6, the top and bottom surface of the stack 500 can also be divided into a plurality of regions. There are six regions (I, II, III, IV, V, VI) delimited by a two-dot chain lines, each of which has one set of groups of vertically aligned electrodes 496A~496F having different functions (merely P1 is shown in FIGS. 16A and 16B). Each stack 500 holds a plurality of groups of vertically arranged electrodes 476A~476C that are shifted in the horizontal plane.

Figure 17B:
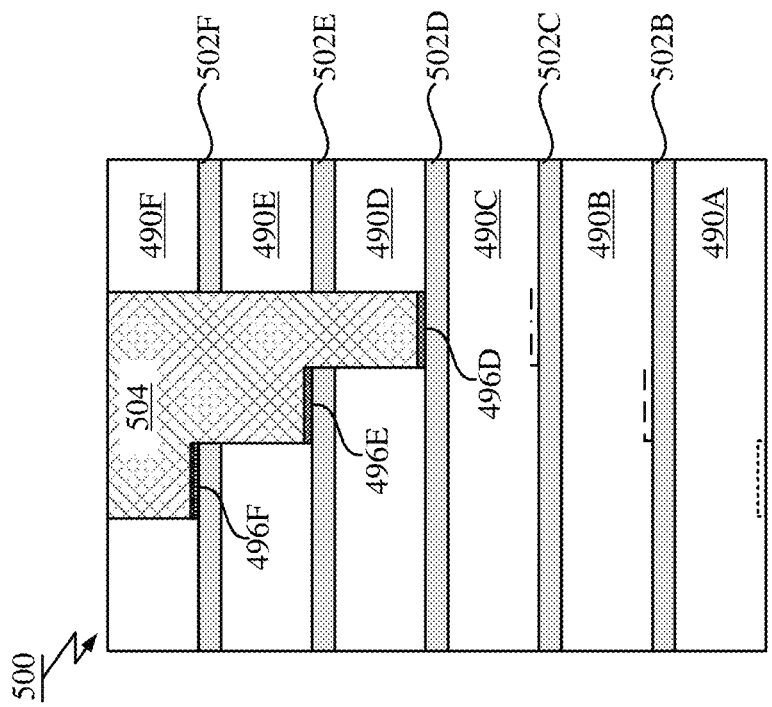
FIGS. 17A and 17B illustrates cross sectional views of a structure obtained at each step of an assembling process with regular hexagon shape according to the particular embodiment of the present invention.
Figure 17A:
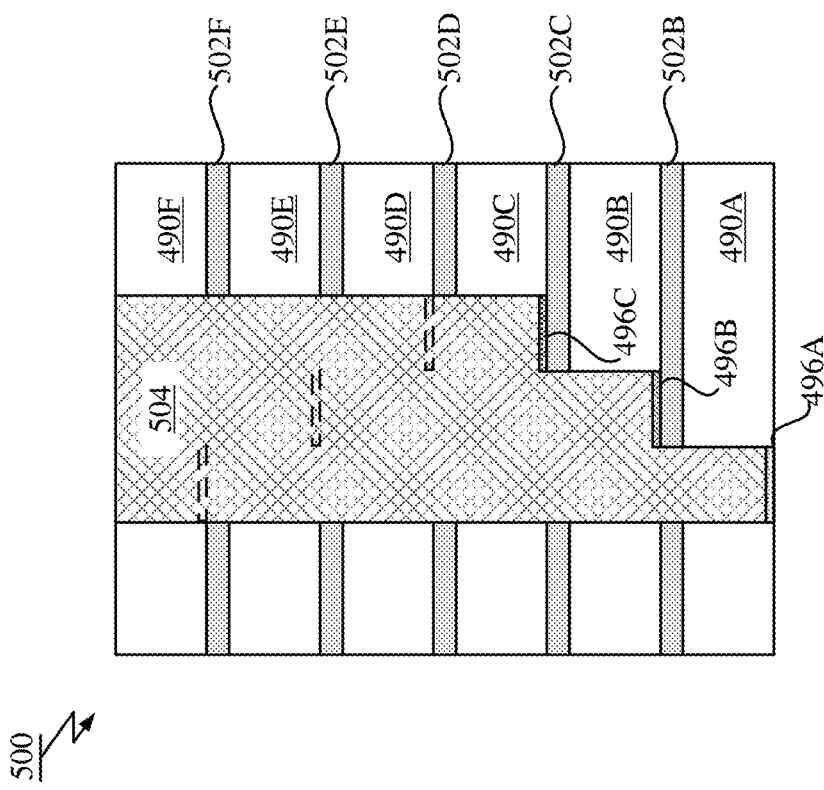

FIGS. 17A and 17B illustrate enlarged cross-sectional views of the stacked chip block 500 around one vertical conductor 504. Note that the cross-sectional views shown in FIGS. 17A and 17B correspond to cross-sections indicated by "I" and "J" in the top view shown in FIG. 16B, respectively.

As shown in FIGS. 17A and 17B, the stack 500 may include a six wafer 490A~490F and five interlayer insulating adhesives 502B~502F interposed therebetween. The vertically arranged electrodes 496A~496F are located at respective levels of the surfaces of the wafers 490A~490F. The vertically arranged electrodes 496A~496F have respective electrode surfaces, each of which is in contact with the vertical conductor 504, resulting in a spiral or helical staircase-like structure.

Among the unit shapes of the regular tessellation, the square shape is superior since it is not required that design tool, lithography tool and dicing tool are adapted for special shape other than rectangular. Rectangular shape is common in the semiconductor process. Thus, standard design tool, lithography tool and dicing tool can be used without any adaptation to handle the chip shapes.

Figures 18A, 18B:
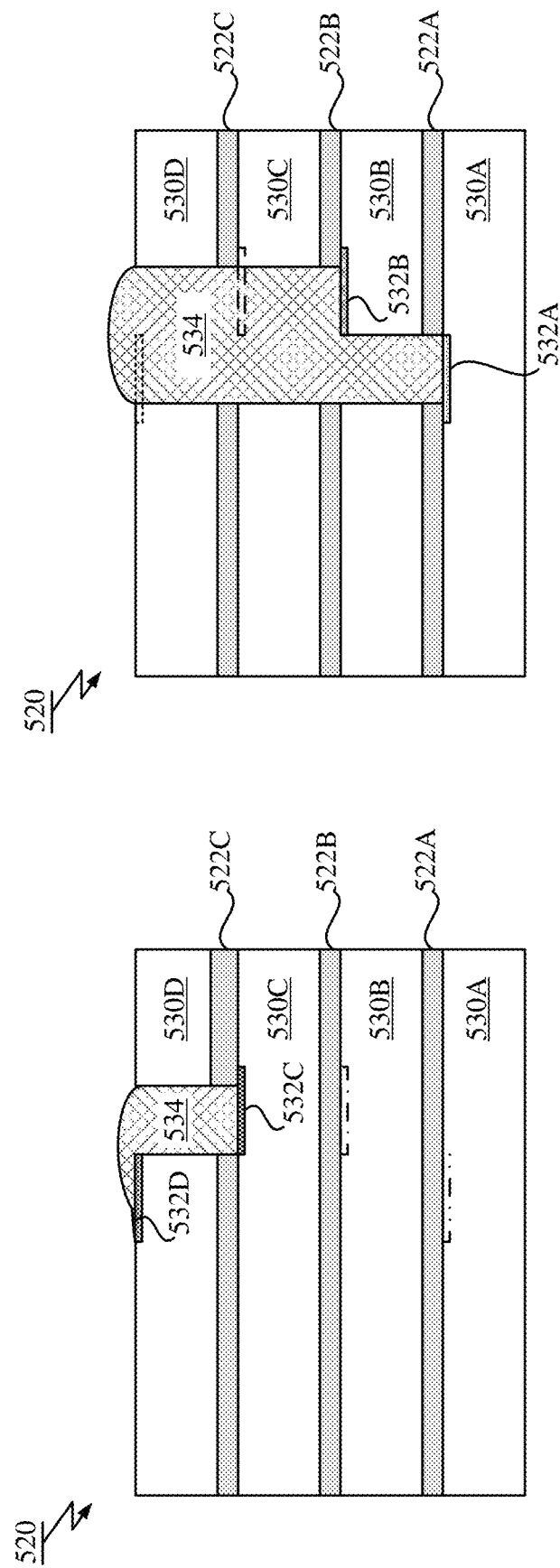
FIGS. 18A and 18B illustrate cross-sectional views of the stacked semiconductor chip assembly with vertical conductors according to alternative embodiment of the present invention.

In the aforementioned embodiments, it has been described that the through hole is formed into the stacked wafers from the back side. However, in other embodiments, the through hole can be formed into the stacked wafers from the front side. FIGS. 18A and 18B illustrate cross-sectional views of the stacked semiconductor chip assembly with vertical conductors according to alternative embodiment where the through hole is formed from the front side of the stacked wafers. Note that FIGS. 18A and 18B are cross-sectional views corresponding to different cross-sections similar to that shown in FIG. 2A with indication of "B" and "C".

As shown in FIGS. 18A and 18B, the stack 520 includes a four wafer 530A~530D and three interlayer insulating adhesives 522A~522C interposed therebetween. The vertically arranged electrodes 532A~532D are located at respective levels of the surfaces of the wafer 530. The vertically arranged electrodes 532A~532D have respective electrode surfaces, each of which is in contact with the vertical conductor 534, resulting in a spiral or helical staircase-like structure. In contrast to the cases show in FIGS. 2B, 2C and FIGS. 7G, 7H, the vertical conductor 534 penetrates through a part of the wafers 530A~530D. In the described embodiment, the number of wafers through which the vertical conductor 534 is formed is three, which corresponds to the order of the rotational symmetry minus one (n−1).

In the aforementioned embodiments, the stacked semiconductor chip assemblies and the semiconductor wafers, on which semiconductor devices are fabricated, has been described. However, the stacked chip structure and the chip structure according to one or more embodiments of the present invention are not limited to one relating to semiconductor device. In an embodiment, the stacked chip structure and the chip structure can be one related to a thin film battery.

Hereinbelow, with reference to FIGS. 19A, 19B and 19C, a stacked battery chip assembly 600 with vertical conductors 630 according to further other embodiment of the present invention will be described.

Figure 19A:
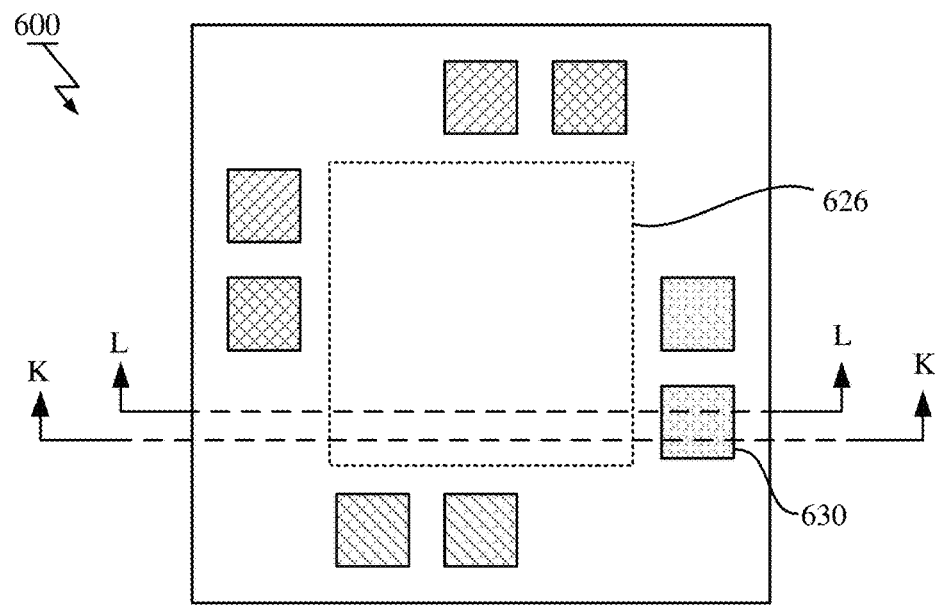
FIGS. 19A, 19B and 19C illustrate a top view and cross-sectional views of a stacked battery chip assembly with vertical conductors according to further other embodiment of the present invention.

FIG. 19A shows e a top view and cross-sectional views of the stacked battery chip assembly 600. FIGS. 19B and 19C show cross-sectional views of the stacked battery chip assembly 600. Note that the cross-sectional views shown in FIGS. 19B and 19C correspond to cross-sections indicated by "K" and "L" in the top view shown in FIG. 19A, respectively.

Figure 19B:
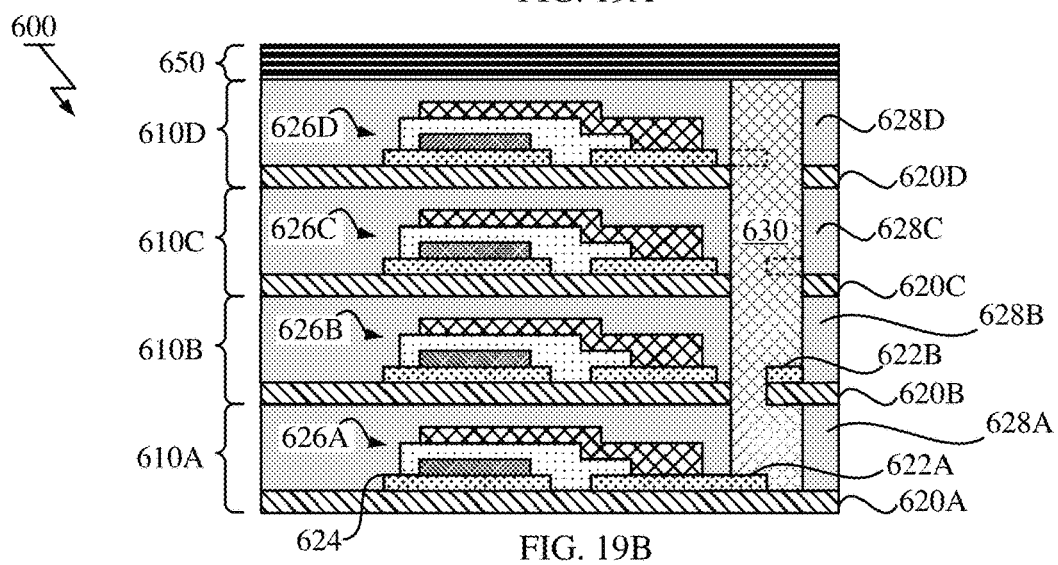
Figure 19C:
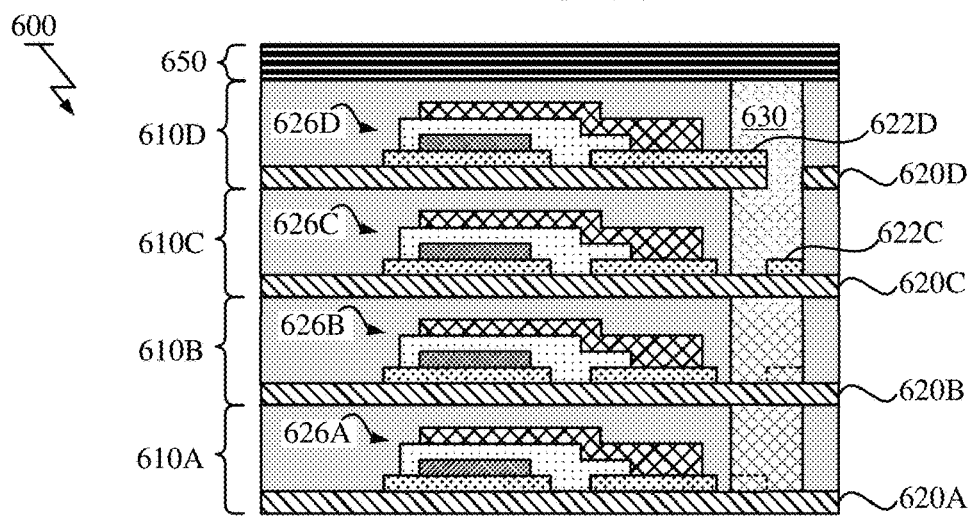

As shown in FIGS. 19A, 19B and 19C, the stacked battery chip assembly 600 includes a plurality of battery chip layers 610A~610D; a plurality of vertical conductors 630 formed into the battery chip layers 610A~610D; and a wiring layer 650. The wiring layer 650 that is built on the top of the stacked battery chip layers 610A~610D may have a wiring pattern connecting the vertical conductor 630 with external terminals that may be connected to the external device such as a CPU (Central Processing Unit), memory etc.

Each battery chip layer 610 may include a substrate 620, a solid thin film battery element 626 fabricated on the substrate 620 and an insulator 628 formed over the solid thin film battery element 626 and the substrate 620.

The substrate 620 may be made of any one of non-conductive substrate materials such as a silicon, a alumina ceramic, a glass, mica, etc. to name but a few. The insulator 628 may be made from a resin such as BCB (benzocyclobutene) resin, etc. Each solid thin film battery element 626 may include a cathode current collector (CCC) 624; a cathode; an electrolyte; an anode; and an anode current collector (ACC) 622.

The cathode current collector 624 and the anode current collector 622 may be formed on the substrate 620, which correspond to the electrodes assigned different functions. In this embodiment, the functions include anode and cathode. The cathode current collector 624 and the anode current collector 622 may be made of any one of metals (e.g., Cu, Pt, Al, Au, etc.) and other conductive materials (e.g. graphite, carbon nanotube, silicon, etc.).

The plurality of the battery chip layers 610A~610D may be bonded by the insulator 627A~628C that is formed in the battery chip layers 610A~610C.

As shown in FIGS. 19B and 19C, the vertically arranged electrodes 622A~622D are located at respective levels of the surfaces of the substrates 620 of the battery layers 610. The vertically arranged electrodes 622A~622D have respective electrode surfaces, each of which is in contact with the vertical conductor 630, resulting in a spiral or helical staircase-like structure. The novel structure of the vertical conductors is beneficial to such thin film solid state battery since the battery has only anode and cathode electrodes assigns.

FIGS. 20A-20C illustrate cross-sectional views of a structure obtained at each step of related assembling process in which a plurality of electrode layouts are dedicatedly designed for each stacking level.

Referring to FIG. 20A, the related assembling process includes a step of preparing a plurality of wafers 710A~710D, each of which includes electrode layout dedicatedly designed for a corresponding stacking level. With reference to FIG. 20B, the related assembling process also includes a step of sequentially stacking the plurality of the wafers 250A~250D with adhesives 702B~702D and a step of forming a through hole 728 into the wafer 710A~710D so as to expose electrode surfaces 712A~712D. With reference to FIG. 20C, the related assembling process includes a step of filling the through hole 728 with conductive material 730.

As described in FIGS. 20A, 20B and 20C, when employing an approach where through holes are drilled after stacking, terminal electrodes for the through via are generally designed as a step structure in order to ensure sufficient contact with conductive material. Therefore, the design of the through holes is demanded to be different for each stacking level even though the chips are homogeneous (i.e., homogeneous integration).

As shown in FIGS. 20A, 20B and 20C, electrode designs and mask patterns are unique for each stacking level of the wafers. In this case, unique part number (P/N) is assigned to each stacking level of the wafers. Thus, multiple P/Ns are required, thereby complicating production control. Also, when yield of each wafer level is significantly different, many surplus wafers would be produced, thereby degrading efficiency of production process.

In contrast to the related assembling process, in the assembling process according to one or more embodiments of the invention, variety of chip designs, mask designs and the number of parts numbers can be reduced regardless of stacking level. Thus, design work load, non-recurring engineering cost, complexity of production control and waste of production can be reduced. Thereby, production control of chip assembly can be simplified and efficiency of production of the chip assembly can be improved.

The stacked chip structure is generally low cost and easy to fabricate with reliable connectivity. Note that some embodiments may not have these potential advantages and these potential advantages are not necessarily required of all embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, steps, layers, elements, and/or components, but do not preclude the presence or addition of one or more other features, steps, layers, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more aspects of the present invention has been presented for purposes of illustration and description, but is not intended to be exhaustive or limited to the invention in the form disclosed.

Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A method, comprising:
preparing a plurality of chip layers, each comprising at least one chip block, each chip block comprising a plurality of electrodes assigned a same function;

sequentially stacking the plurality of the chip layers to form at least one stack of overlapping chip blocks, each stack holding a plurality of groups of vertically arranged electrodes with shifts in horizontal plane;

forming, for at least one of the plurality of groups, a through hole into the plurality of the chip layers to expose electrode surfaces of vertically arranged electrodes in the at least one of the plurality of groups; and filling the through hole with conductive material.

2. The method of claim 1, wherein the at least one chip block comprises an array of chip blocks arranged in a manner of rotational symmetry, the stacking of the plurality of the chip layers is performed such that each chip block in the array of one of the plurality of chip layers overlaps with a symmetrically located chip block in the array of others of the plurality of chip layers, and the at least one stack of the overlapping chip blocks comprises an array of stacks of overlapping chip blocks.

3. The method of claim 2, wherein each chip block has an identical shape having the same rotational symmetry as arrangement of the array of the chip blocks and the plurality of the electrodes for each chip block have respective surfaces arranged such that each surface is configured to be adjacent to and shifted, at least in part, from other ones of the surfaces when a rotation operation around the center of the chip block is applied.

4. The method of claim 2, wherein the stacking of the plurality of the chip layers is performed such that the electrode surfaces of the vertically arranged electrodes in the group are arranged so as to make one round in the horizontal plane.

5. The method of claim 2, wherein the stacking of the plurality of the chip layers comprises:

bonding the plurality of the chip layers with one or more insulating adhesive layers, each stack of the overlapping chip blocks holding a corresponding portion of each of the one or more insulating adhesive layers.

6. The method of claim 5, wherein each corresponding portion of at least two of the one or more insulating adhesive layers have an opening as a part of the through hole to be formed.

7. The method of claim 6, wherein each electrode surface is configured to work as a stopper against hole formation and has a shape enabling formation of a center portion of the through hole penetrating through the plurality of the chip layers, the center portion of the through hole being a portion not covered by any of the electrode surfaces.

8. The method of claim 2, wherein the rotational symmetry of arrangement of the array is n-fold rotational symmetry and each rotation performed in stacking one of the chip layers onto other of the chip layers is a rotation with 360/n*i (i=1, . . . , n−1) degrees around the center of the arrays with respect to a base position of stacking, and the number of the chip layers is n, each chip block has a unit shape of tessellation and the through hole is formed through n or n−1 chip layers.

9. The method of claim 8, wherein n is 4 and each chip block has an approximately square shape.

10. The method of claim 2, wherein the preparing of the plurality of the chip layers, the stacking of the plurality of the chip layers and the forming of the through hole are performed repeatedly to obtain a plurality of stacked layer assemblies, the forming of the through hole is performed such that the through hole penetrates each stacked layer assembly in part, and the method further comprises:

stacking the plurality of the stacked layer assemblies such that the through holes of the stacked layer assemblies communicate with each other, the filling of the through hole being performed at once for the plurality of the stacked layer assemblies.

11. The method of claim 2, wherein the preparing of the plurality of the chip layers and the stacking of the plurality of the chip layers are performed repeatedly to obtain a plurality of stacked layer assemblies, and the method further comprises:

stacking the plurality of the stacked layer assemblies with a translational shift, the forming of the through hole and the filling of the through hole being performed at once for the plurality of the stacked layer assemblies, respectively.

12. The method of claim 2, wherein each chip layer prepared has a form of a wafer or panel and the method further comprises:

dicing the plurality of the chip layers into a plurality of chip assemblies, each chip assembly corresponding to each stack of the overlapping chip blocks.

13. The method of claim 1, wherein the forming of the through hole is performed by etching and/or laser processing and the filling of the through hole is performed by Injection Molded Soldering (IMS) technology.

14. The method of claim 1, wherein each chip block has a semiconductor device or a thin film battery.

15. A chip structure comprising:

a chip layer comprising at least one chip block, each chip block having a plurality of areas wherein there is formation of a via hole through the chip layer; and a plurality of electrodes located at respective positions of the areas for each chip block, the plurality of the electrodes being assigned a same function and having respective electrode surfaces arranged such that each electrode surface is adjacent to other ones of the electrode surfaces with shifts in horizontal plane based on a rotation operation around the center of the chip block and to the other one of the electrode surfaces.

16. The chip structure of claim 15, wherein the at least one chip block of the chip layer comprises an array of chip blocks arranged in a manner of rotational symmetry such that each chip block in the array of the chip layer overlaps with other symmetrically located chip block in the array of the chip layer when a rotation operation around the center of the array of the chip layer is applied to the other symmetrically located chip block.

17. The chip structure of claim 16, wherein each chip block in the array of the chip layer has an identical shape having the same rotational symmetry as arrangement of the array of the chip blocks.

18. The chip structure of claim 16, wherein the chip structure further comprises:

an insulating adhesive layer formed on or in the chip layer, each insulating adhesive layer comprising a plurality of portions corresponding to the array of the chip blocks.

19. The chip structure of claim 18, wherein each portion of the insulating adhesive layer has a plurality of openings located at positions of the electrode surfaces.

20. The chip structure of claim 16, wherein the rotational symmetry is n-fold rotational symmetry, the rotation operation around the center of the array is a rotation with 360/n degrees, the rotation operation around the center of the chip block is a rotation with 360/n degrees and each chip block in the array has a unit shape of tessellation.

21. A stacked chip structure comprising:

a plurality of chip layers stacked with rotations so as to form a stack of overlapping chip blocks, at least two of the overlapping chip blocks in the stack having respective via holes communicating with each other to form a through hole; and a plurality of groups of vertically arranged electrodes assigned a same function, for the stack of the overlapping chip blocks, the vertically arranged electrodes in each group being arranged to have shifts in horizontal plane; and a conductive material filled in the through hole for the stack of the overlapping chip blocks, the conductive material filled in the through hole being in contact with electrode surfaces of vertically arranged electrodes of one of the groups.

22. The stacked chip structure of claim 21, wherein each chip layer comprises one chip block, the plurality of the chip layers is stacked such that the chip block of one of the chip layers overlaps with the chip block of other of the chip layers in a manner of rotational symmetry, and the stacked chip structure is a singulated chip assembly.

23. The stacked chip structure of claim 21, wherein each chip layer comprises an array of chip blocks arranged in a manner of rotational symmetry, the plurality of the chip layers being stacked such that each chip block in the array of one of the chip layers overlaps with a symmetrically located chip block in the array of other of the chip layers so as to configure the stack of the overlapping chip blocks and one or more other stacks of overlapping chip blocks, the stack and the other stacks of the overlapping chip block being arranged in an array.

24. The stacked chip structure of claim 23, wherein the electrode surfaces of the vertically arranged electrodes of the one of the groups are arranged so as to make one or more rounds around the center of the through hole and the plurality of the chip layers includes at least one unit of stacked layers, each unit of stacked layers corresponding to one round.

25. The stacked chip structure of claim 23, wherein the stacked chip structure further comprises:

two or more of insulating adhesive layers, each insulating adhesive layer bonding adjacent two of the chip layers and comprising a plurality of portions corresponding to the array of the stacks of the overlapping chip blocks, at least two of corresponding portions relating to the one group having respective openings as parts of the through hole.

\* \* \* \* \*